US009496190B2

United States Patent
Xu et al.

(10) Patent No.: US 9,496,190 B2
(45) Date of Patent: Nov. 15, 2016

(54) FEEDBACK OF LAYER THICKNESS TIMING AND CLEARANCE TIMING FOR POLISHING CONTROL

(71) Applicant: Applied Materials, Inc., Santa Clara, CA (US)

(72) Inventors: Kun Xu, Fremont, CA (US); Feng Liu, San Jose, CA (US);
(Continued)

(73) Assignee: Applied Materials, Inc., Santa Clara, CA (US)

( * ) Notice: Subject to any disclaimer, the term of this patent is extended or adjusted under 35 U.S.C. 154(b) by 88 days.

(21) Appl. No.: 14/665,889

(22) Filed: Mar. 23, 2015

(65) Prior Publication Data

US 2015/0194356 A1     Jul. 9, 2015

Related U.S. Application Data

(63) Continuation of application No. 12/697,177, filed on Jan. 29, 2010, now Pat. No. 8,989,890.

(51) Int. Cl.
*H01L 21/66* (2006.01)
*H01L 21/306* (2006.01)
(Continued)

(52) U.S. Cl.
CPC ............. *H01L 22/26* (2013.01); *B24B 37/005* (2013.01); *B24B 37/013* (2013.01); *B24B 49/12* (2013.01);
(Continued)

(58) Field of Classification Search
CPC ................ B24B 37/013; B24B 37/205; B24B 49/08; B24B 49/12; H01L 22/26;
(Continued)

(56) References Cited

U.S. PATENT DOCUMENTS 5,249,175 A   9/1993  Akahira et al.
5,351,855 A   10/1994 Nelson et al.
(Continued)

OTHER PUBLICATIONS

Technos International, "S-MAT—Thin Film Thickness Measurement Technology—X Ray SECS GEM", product information [online], [retrieved on May 3, 2010], 3 pages. Retrieved from the Internet:<URL: http://www.technos-intl.com/smatonproduct.php>.
(Continued)

*Primary Examiner* — Sean Shechtman
(74) *Attorney, Agent, or Firm* — Fish & Richardson P.C.

(57) ABSTRACT

During polishing of a first substrate at a first polishing station, a sequence of measurements by a first in-situ monitoring system is monitored to determining a first time at which the first sequence exhibits a first predefined feature indicating a predetermined thickness of an overlying layer, and during polishing of the first substrate at a second polishing station, a sequence of measurements by a second in-situ monitoring system is monitored to determine a second time indicating clearance of the overlying layer and exposure of the underlying layer. The first time is used to calculate a first adjusted polishing pressure for a second substrate at the first polishing station, and the second time is used to calculate a second adjusted polishing pressure for the second substrate at the second polishing station.

21 Claims, 18 Drawing Sheets

(72) Inventors: Dominic J. Benvegnu, La Honda, CA (US); Boguslaw A. Swedek, Cupertino, CA (US); Yuchun Wang, Santa Clara, CA (US); Wen-Chiang Tu, Mountain View, CA (US); Laksh Karuppiah, San Jose, CA (US)

(51) Int. Cl.
*C01G 9/00* (2006.01)
*B24B 37/005* (2012.01)
*B24B 37/013* (2012.01)
*B24B 49/12* (2006.01)
*G01B 11/06* (2006.01)
*H01L 45/00* (2006.01)

(52) U.S. Cl.
CPC ............. *C01G 9/00* (2013.01); *G01B 11/0625* (2013.01); *G01B 11/0683* (2013.01); *H01L 21/30625* (2013.01); *H01L 45/06* (2013.01); *H01L 45/1233* (2013.01); *H01L 45/144* (2013.01); *H01L 45/1683* (2013.01)

(58) Field of Classification Search
CPC ........... H01L 21/31053; H01L 21/3212; B24D 7/14
See application file for complete search history.

(56) References Cited

U.S. PATENT DOCUMENTS

| | | | |
|---|---|---|---|
| 5,481,530 A | 1/1996 | Ueda et al. | |
| 5,883,720 A | 3/1999 | Akiyama et al. | |
| 5,921,855 A | 7/1999 | Osterheld et al. | |
| 6,010,538 A * | 1/2000 | Sun | B24B 37/013 156/345.13 |
| 6,159,073 A | 12/2000 | Wiswesser et al. | |
| 6,309,290 B1 | 10/2001 | Wang et al. | |
| 6,406,924 B1 | 6/2002 | Grimbergen et al. | |
| 6,747,283 B1 * | 6/2004 | Amartur | B24B 37/013 250/559.27 |
| 6,897,079 B2 | 5/2005 | Hirose et al. | |
| 7,115,017 B1 | 10/2006 | Laursen et al. | |
| 7,195,535 B1 * | 3/2007 | Swedek | B24B 49/12 451/288 |
| 7,559,823 B2 * | 7/2009 | Sato | H01L 21/67219 451/11 |
| 7,822,500 B2 * | 10/2010 | Kobayashi | B24B 37/005 451/5 |
| 8,639,377 B2 | 1/2014 | Xu et al. | |
| 8,989,890 B2 | 3/2015 | Xu et al. | |
| 2002/0098777 A1 | 7/2002 | Laursen et al. | |
| 2002/0197871 A1 | 12/2002 | Hirose et al. | |
| 2003/0104761 A1 | 6/2003 | Wiswesser et al. | |
| 2003/0153246 A1 * | 8/2003 | Desai | B24B 21/04 451/8 |
| 2004/0190432 A1 | 9/2004 | Ichihara et al. | |
| 2005/0020185 A1 | 1/2005 | Zuniga et al. | |
| 2005/0088647 A1 | 4/2005 | Shanmugasundram et al. | |
| 2005/0143852 A1 | 6/2005 | Roover et al. | |
| 2005/0213479 A1 | 9/2005 | Takamori et al. | |
| 2006/0164104 A1 * | 7/2006 | Tada | G01B 15/02 324/646 |
| 2006/0166606 A1 * | 7/2006 | Kobayashi | B24B 37/013 451/6 |
| 2007/0057308 A1 | 3/2007 | Min et al. | |
| 2007/0108488 A1 | 5/2007 | Suh et al. | |
| 2007/0224915 A1 | 9/2007 | David et al. | |
| 2008/0081510 A1 * | 4/2008 | Porter | G01R 11/04 439/517 |
| 2008/0190035 A1 | 8/2008 | Lu et al. | |
| 2008/0243443 A1 | 10/2008 | Lerner et al. | |
| 2009/0001339 A1 * | 1/2009 | Lee | C09G 1/04 257/2 |
| 2010/0130013 A1 * | 5/2010 | Liu | C09G 1/02 438/693 |

OTHER PUBLICATIONS

Commercial_laser_lines_svg.pdf, 1page.
Infrared Spectroscopy.pdf, 5 pages.
International Search Report and Written Opinion dated Sep. 3, 2012 from corresponding application PCT/US2011/022138.

* cited by examiner

US 9,496,190 B2

FEEDBACK OF LAYER THICKNESS TIMING AND CLEARANCE TIMING FOR POLISHING CONTROL

CROSS-REFERENCE TO RELATED APPLICATIONS

This application is a continuation of U.S. application Ser. No. 12/697,177, filed on Jan. 29, 2010, which is incorporated by reference.

TECHNICAL FIELD

This disclosure relates to feedback of metrology measurements to control polishing.

BACKGROUND

GeSbTe, a ternary compound of Germanium, Antimony and Tellurium, also known as GST, is a phase change material from the group of chalcogenide glasses, used in rewritable optical discs and phase-change memory applications.

A characteristic that makes GST useful as a phase-change memory is its ability to effect a reversible phase change when heated or cooled, switching between stable high resistance amorphous phase to low resistance crystalline phase in nanosecond-timescale. GST memory has many desirable qualities such as better scaling quality, fast read/write speed, strong cycling performance, compatibility with current CMOS logic process, non-volatility, endurance of more than $10^{13}$ read-write cycles, non-destructive read, direct overwriting, and data retention time of more than 10 years.

A typical phase-change memory device includes layers such as a top electrode, a GST layer, a bottom electrode and other dielectric layers. Production of a phase-change memory device is similar to production of a typical integrated circuit, which involves sequential deposition of conductive, semiconductive, or insulative layers on a substrate, such as a silicon wafer. One fabrication step involves depositing a filler layer over a non-planar surface and planarizing the filler layer. For certain applications, the filler layer is planarized until the top surface of a patterned layer is exposed.

A GST layer, for example, can be deposited on a patterned insulative layer to fill holes in the insulative layer. After planarization, the portions of the GST layer remaining between the raised patterns of the insulative layer form plugs that provide the memory cells on the substrate.

Chemical mechanical polishing (CMP) is one accepted method of planarization. This planarization method typically requires that the substrate be mounted on a carrier or polishing head. The exposed surface of the substrate is placed against a rotating polishing pad. The carrier head provides a controllable load, i.e., pressure, on the substrate to push it against the polishing pad. A polishing liquid, such as a slurry with abrasive particles, is supplied to the surface of the polishing pad. The substrate surface is then polished by the moving polishing pad until an end point is called.

In order to determine the effectiveness of a polishing operation, a "blank" substrate (e.g., a wafer with multiple layers but no pattern) or a test substrate (e.g., a wafer with the pattern to be used for device wafers) is polished in a tool/process qualification step. After polishing, the substrate is removed from the polishing system and the remaining layer thickness (or another substrate property relevant to circuit operation, such as conductivity) is measured at several points on the substrate surface using an in-line or stand-alone metrology station. The variation in layer thickness provide a measure of the wafer surface uniformity, and a measure of the relative polishing rates in different regions of the substrate. Polishing parameters, such as polishing time and polishing load, can be adjusted in subsequent polishing operations based on the resulting metrology results.

GST has two stable structural phase states, crystalline and amorphous. In its stable state, crystalline GST has two possible configurations: hexagonal and a metastable face centered cubic (FCC) lattice. When GST is rapidly crystallized, it can also have a distorted rocksalt structure. GST also has many vacancies in the lattice, ranging from 20% to 25% depending on the specific GST compound.

Existing in-line or stand-alone metrology station using ellipsometry or X-ray reflectometry (XRR) can provide accurate and reliable thickness measurements (e.g., using ellipsometry) and precise positioning of a sensor to desired measurement locations on the substrate. Structrual phase can be determined using X-ray diffraction methods.

SUMMARY

In one aspect, a method includes polishing a first substrate having a layer of GST, the layer of GST disposed over an underlying layer, during polishing, directing a non-polarized light beam onto the layer of GST, the non-polarized light beam reflecting from the first substrate to generate a reflected light beam having an infra-red component, during polishing, generating a sequence of measurements of intensity of the infra-red component of the reflected light beam, and in a processor, determining a time at which the sequence of measurements exhibits a predefined feature.

Implementations can include one or more of the following. The non-polarized light beam may be a laser beam. The laser beam may have a wavelength of approximately 1.3 microns. The non-polarized light beam may include a broadband near infrared component. The infra-red component of the reflected light beam may be a near infra-red component. The measurements may be sorted into groups, each group associated with a different zone of a plurality of zones on the substrate, and for each zone a time may be determined at which the sequence of measurements from the associated group exhibits a predefined feature. The zones may be concentric radial zones. Polishing may include polishing with a carrier head having a plurality of chambers to apply independently adjustable pressures to the plurality of zones on the substrate. During polishing of the first substrate, a first chamber of the plurality of chambers may apply a first pressure to a first zone of the plurality of zones and a second chamber of the plurality of chambers may apply a second pressure to a second zone of the plurality of zones. Determining a time at which the underlying layer is exposed for each zone may include determining a first time for a first zone from the plurality of zones and determining a second time for a second zone from the plurality of zones. At least one adjusted polishing pressure may be calculated for the first chamber based on the first pressure, the first time and the second time. The second zone may be an innermost zone or an outermost zone. Calculating the adjusted pressure P1' may include calculating P1'=P1*(T1/T2) wherein P1 is the first pressure, T1 is the first time and T2 is the second time. A second substrate having a layer of GST may be polished using the adjusted polishing pressure. A time at which the underlying layer is exposed may be determined from the sequence of measurements. Determining a time at which the underlying layer is exposed may include determining a time at which the sequence of measurements stabilizes. Determining a time at which the sequence of measurements stabilizes may include determining that a slope of a trace generated by the sequence of measurements remains within a predetermined range for a predetermined time period. A time at the layer of GST has a predefined thickness may be determined from the sequence of measurements. Determining the time at which the underlying layer is exposed may include determining the time at which the sequence of measurements has a peak or valley.

In another aspect, a method include polishing a first substrate having a layer at a first polishing station, during polishing at the first polishing station, directing a first light beam onto the layer, the first light beam reflecting from the first substrate to generate a first reflected light beam, during polishing at the first polishing station, generating a first sequence of first measurements of intensity of the first reflected light beam, sorting the first measurements into groups, each group associated with a different zone of a plurality of zones on the substrate, and for each zone determining a first time at which the first sequence of first measurements from the associated group exhibits a first predefined feature indicating a predetermined thickness of the layer, calculating at least one first adjusted polishing pressure for at least zone based on a pressure applied in the at least one zone during polishing the substrate at the first polishing station, the first time for the at least one zone, and the first time for another zone, transferring the substrate from the first polishing station to a second polishing station, polishing a second substrate at the first polishing station using the at least one adjusted polishing pressure, polishing the first substrate at the second polishing station, during polishing at the second polishing station, directing a second light beam onto the layer, the second light beam reflecting from the first substrate to generate a second reflected light beam, during polishing at the second polishing station, generating a second sequence of second measurements of intensity of the second reflected light beam, sorting the second measurements into groups, each group associated with a different zone of the plurality of zones on the substrate, and for each zone determining a second time at which the second sequence of first measurements from the associated group exhibits a second predefined feature indicating clearance of the layer, calculating at least one second adjusted polishing pressure for at least zone based on a pressure applied in the at least one zone during polishing the substrate at the second polishing station, the second time for the at least one zone, and the second time for another zone, and polishing the second substrate at the second polishing station using the at least one adjusted polishing pressure.

In another aspect, a computer-readable medium has stored thereon instructions, which, when executed by a processor, causes the processor to perform operations including during polishing, causing a light source to direct a non-polarized light beam onto a layer of GST on a substrate, the non-polarized light beam reflecting from the first substrate to generate a reflected light beam having an infra-red component, during polishing, receive a sequence of measurements of intensity of the infra-red component of the reflected light beam, and determining a time at which the sequence of measurements exhibits a predefined feature.

Implementations can include one or more of the following potential advantages. Structural phase and thickness of a GST layer on a semiconductor substrate can be determined in a fast, economic and robust way in that is unavailable in traditional metrology systems such as those using XRR, ellipsometry or X-ray diffraction methods. The measurements can based on infra-red transmission property of the GST layer and need not be appreciably obstructed by the presence of the substrate or underlying patterns. The metrology system can be implemented as an in-line or stand-alone system. The metrology system can be utilized during tool qualification or actual production. The thickness and structural phase measurements can be carried out prior to, during, or after processing, and the results utilized for selection and adjustment of polishing parameters and endpoint detection. GST layer thickness can be monitored in-situ, and polishing uniformity can be improved.

The details of one or more embodiments are set forth in the accompanying drawings and the description below. Other aspects, features and advantages will be apparent from the description and drawings, and from the claims.

DETAILED DESCRIPTION

Specific to CMP of a GST layer, polishing rate is affected by the structural phase of the GST film as well as its thickness profile. It is therefore useful to be able to identify both the structural phase state of a particular GST layer and its thickness in a polishing operation. However, the traditional XRR, ellipsometry, and X-ray diffraction metrology processes can be time-consuming, and the metrology equipment can be costly. Therefore, there is a need for a fast, economic, and accurate technique for determining GST layer thickness and structural phase for CMP applications.

The present invention offers such a fast and economic metrology method that can be practiced in an in-line or standalone metrology station for a CMP system. This in-line or standalone metrology system can be used before or after processing, e.g., polishing, of a substrate, and the substrate characteristics such as GST layer thickness and phase information derived from the measurements can be used for feed-forward or feed-back control of the polishing system. For example, an in-line metrology system can measure the GST layer thickness at multiple points along a radius or diameter of the substrate prior to polishing, and the measured layer thickness data can be used to control the polishing system (e.g., select endpoint criteria or polishing head pressures) during polishing of that substrate. For another example, the in-line metrology system could measure the GST layer thickness at multiple points along a radius or diameter of the substrate after polishing, and the measured layer thickness data could be used to control the polishing system (e.g., select endpoint criteria or polishing head pressures) during polishing of a subsequent substrate.

Figure 1:
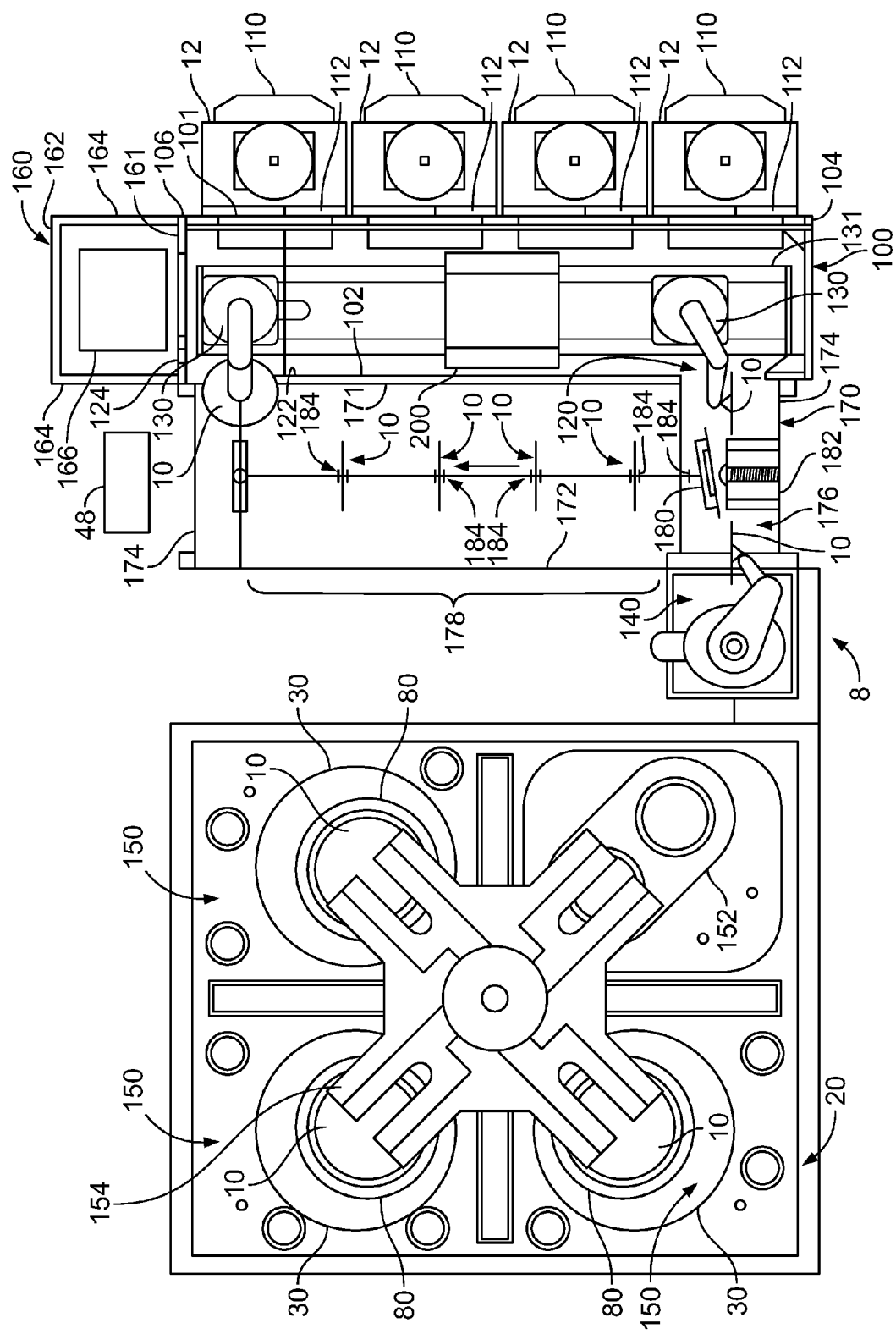
FIG. 1 is a top view of an example substrate processing system having an in-line metrology/monitoring system.

An implementation of a substrate processing system 8 that includes an in-line metrology system 200 is illustrated in FIG. 1. The substrate processing system 8 includes the chemical mechanical polishing apparatus 20, a factory interface module 100, a wet robot 140, and a cleaner 170. Substrates 10, e.g., silicon wafers with one or more layers deposited thereon, are transported to the substrate processing system 8 in cassettes 12, and are extracted from the cassettes 12 by the factory interface module 100 for transport to the polishing apparatus 20 and the cleaner 170. The operations of the substrate processing system 8 are coordinated by controller 48, such as one or more programmable digital computers executing control software. Some of the modules, such as the wet robot 140 and cleaner 170, can be omitted, depending on the configuration of the processing system, and the processing system can include other modules, such as a deposition or etching apparatus.

The polishing apparatus 20 can include a series of polishing stations 150 and a transfer station 152. The transfer station 152 serves multiple functions, including receiving individual substrates 10 from the wet robot 140, washing the substrates and loading the substrates into carrier heads. Each polishing station can includes a rotatable platen holding a polishing pad 30. Different polishing pads can be used at different polishing stations. A rotatable carousel 154 that holds four carrier heads 80 is supported above the polishing stations (drive systems above the carrier heads and the carrier head over the transfer station are not illustrated in FIG. 1 to provide a clearer top view). The carousel 154 rotates to carry the substrates between the polishing stations 150 and the transfer station 152. Generally, the carrier head holds the wafer against the polishing pad, distributes a downward pressure across the back surface of the wafer, transfers torque from the drive shaft to the wafer, and ensures that the wafer does not slip out from beneath the carrier head during polishing operations. In addition, the carrier head 80 can be configured to laterally oscillate across the polishing pad, e.g., move along a radius of the polishing pad.

The cleaner 170 can be generally rectangular shaped cabinet with a front wall 171, a back wall 172, and two side walls 174. The interior of the cleaner 170 is divided into an input or staging section 176 and a cleaning section 178. The staging section 176 includes a substrate-pass through support 180 and an indexable buffer 182, each of which can hold one or more substrates in a vertical orientation. The cleaner also includes a walking beam 184 which can hold a substrate in a vertical orientation.

The wet robot 140 is configured to transport the substrate between the staging section 176 and the polishing apparatus 20.

The factory interface module 100 can be substantially rectangular in shape and include an outer wall 101, an inner wall 102, a first side wall 104, and a second side wall 106. The outer wall 101 can be aligned with a cleanroom wall. A plurality (e.g., four) cassette support plates 110 project from the outer wall 101 into the cleanroom to accept the cassettes 12, and a plurality of cassette ports 112 are formed in the outer wall 101 to permit transport of the substrates from the cassettes 12 into the factory interface module 100. The inner wall 104 mates against a front wall 171 of the cleaner 170 and shares an entry port 120 (to the staging section 176) and an exit port 122 (from the end of the cleaning section 178) with the cleaner front wall 171. The inner wall 102 and the cleaner front wall 171 may be combined into one structure, and there may be additional ports from the factory interface module 100 to the cleaner 170.

Figure 2:
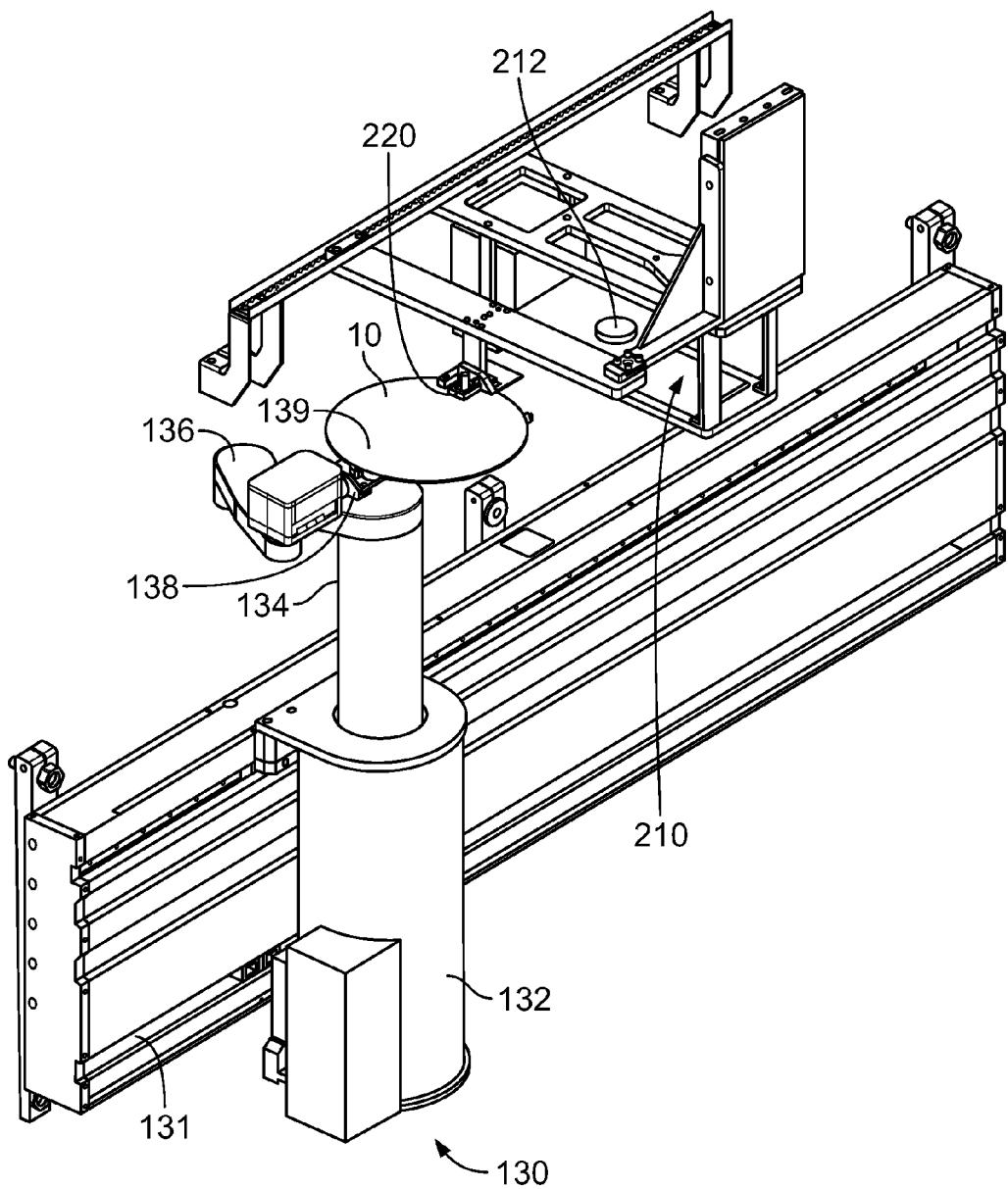
FIG. 2 is a perspective view of an interior of an example factory interface module.
Figure 3:
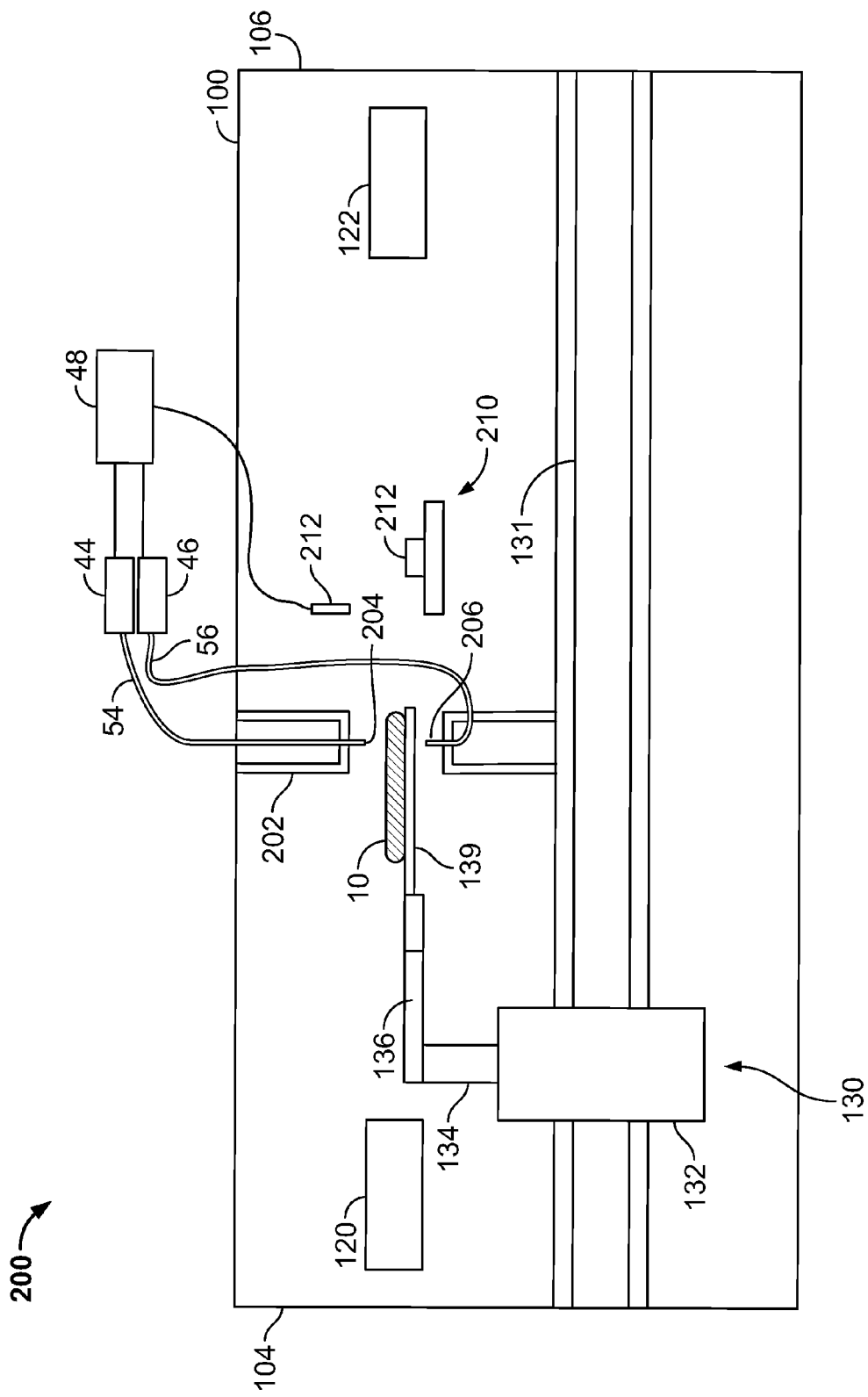
FIG. 3 is a side view of an example factory interface module having an in-line metrology/monitoring system.

One or more factory interface wafer handlers 130 (hereinafter simply "robot"), depicted in greater detail in FIGS. 2 and 3, are housed within the factory interface module 100. In some implementations the factory interface robot 130 has a base 132, a rotatable vertical shaft 134 extending from the base 132, a horizontally extendible articulated arm 136 supported by the shaft 134, a rotary actuator 138 at the end of the articulated arm 136, and a substrate gripper 139 (in phantom below the substrate 10 in FIG. 2) supported by the rotary actuator 138. The vertical shaft 134 is capable of lifting and lowering the articulated arm 136 vertically. Rotation of the vertical shaft 134 permits rotary motion of the articulated arm 136 about a vertical axis, and the articulated arm 136 is configured to extend and retract horizontally. The rotary actuator can be pivotally connected to the end of the articulated arm 136 so as to be rotatable about a vertical axis. In addition, the rotary actuator 138 can rotate the substrate gripper 139 about a horizontal axis. The factory interface robot 130 thus provides a wide range of motion to manipulate the substrate held by the gripper 139. The gripper 139 can be a vacuum chuck, an electrostatic chuck, an edge clamp, or similar wafer gripping mechanism. The factory interface robot can also include an optical detector to sense whether a substrate is being held by the gripper 139. Sensors, e.g., encoders, can be used to detect the position of the movable elements of the robot 130 so that the position of the gripper 139 and substrate 10 can be calculated.

The base 132 can be supported on a linear rail 131 that extends parallel to the inner and outer walls 102 and 101. A motor can drive the factory interface robot 130 laterally along the rail 131 to access the entry port 120, the exit port 122, the cassette ports 112 (FIG. 1 illustrates two positions along the slide 142 for the factory interface robot 130), and the in-line metrology system 200 within the factory interface 100.

FIG. 3 shows the example in-line metrology system 200 including a light source 44 and a light detector 46. Light passes from the light source 44, through an optical guide, impinges a substrate 10 held in the factory interface 100, transmits through the substrate 10 and into another optical guide, and travels to the light detector 46. An optical cable 54 can be used to transmit light from the light source 44 to the substrate 10, and another optical cable 56 can be used to transmit light transmitted through the substrate 10 to the light detector 46. The optical cables 54 and 56 have ends 204 and 206 respectively fixed in positions selected to be in proximity to the substrate 10 when the substrate is scanned by the metrology system. The other ends of the optical cables 54 and 56 are connected to the light source 44 and light detector 46, respectively. The light source 44 and the light detector 46 are connected to a computing device 48 that performs the various computational steps in the metrology process. Although FIG. 3 illustrates the light source 44 and a light detector 46 as positioned outside the factory interface 100, these components can also be located inside the factory interface 100.

A bracket 202 secured to a wall of the factory interface 100 can hold the optical fiber 54 and 56 in a fixed position inside the factory interface 100. The robot 130 can be controlled to sweep the substrate at a working distance of two to thirty-five millimeters from the ends 204 and 206 of the optical fibers.

There is usually an optimal distance between the substrate 10 and the ends of the optical fibers 204 and 206. The optimal distance can be empirically determined and is affected by, for example, the shape of the light beam emitted from optical fiber. In one implementation, the ends are held as close as possible to the surface of the substrate without touching the substrate.

For GST film thickness and phase determination, the light source is operable to emit non-polarized light within the infra-red range. In some implementations, the light source 44 can be a broadband light source emitting light covering an infra-red range. In some implementations, the light source can be a plurality of monochromatic lasers emitting infra-red radiation at a plurality of distinct frequencies. In some implementations, the light source can be a single laser emitting infra-red radiation at a predetermined frequency selected by a user. In some implementations, the light source can generate light pulses having significant frequency components within the infra-red range. In some implementations, the light source 44 emits light having wavelengths in the 2-5 microns range, suitable for GST thickness measurements. In some implementations, the light source 44 emits light having wavelengths in the 10 micron range, suitable for GST structural phase measurements.

In some implementations, the light detector 46 can be a spectrometer. A spectrometer is essentially an optical instrument for measuring properties of light, for example, intensity, over a portion of the electromagnetic spectrum. A suitable spectrometer is a grating spectrometer. Typical output for a spectrometer is the intensity of the light as a function of wavelength or frequency. In some implementations, the light detector 46 can be an infra-red photo-sensor. Most photo-sensors consist of semiconductor having photoconductivity, in which the electrical conductance varies depending on the intensity of radiation striking the material. In some implementations, the light detector 46 measures light intensity at a single frequency. In some implementations, the light detector 46 can measure intensity spectrum in an infra-red frequency band.

The light source 44 and light detector 46 are connected to a computing device 48 operable to control their operation and to receive their signals. Optionally, the optical monitoring system can make a sequence of spectral measurements as the ends 204 and 206 of the optical cables 54 and 56 scan across the substrate 10. The locations of the measurements can trace an arc across the substrate due to the rotation of the articulated arm 136. Optionally, the computer can cause the light source 44 to emit a series of flashes starting just before and ending just after the substrate 10 passes over the ends 204 and 206 of the optical cables 54 and 56, with each flash corresponding to a measurement location. Alternatively, the computer can cause the light source 44 to emit light continuously starting just before and ending just after the substrate 10 passes over the ends 204 and 206 of the optical fibers 54 and 56.

Optionally, the measurements can be made at multiple locations of interest on the substrate. Locations having a lower density of geometrical features than other discrete regions of the wafer can be selected as well-defined points for measurements. For example, well-defined points may include regions in which bond pads are placed, or regions in which surfaces of uniform material composition are formed.

The computing device 48 can include a microprocessor situated near the polishing apparatus, e.g., a programmable computer, such as a personal computer. The computing device can, for example, synchronize activation of the light source 44 and the light detector 46 with the movement of the articulated arm 136. The computing device 48 can further be programmed to store spectral intensity measurements from the detector, to display the spectra on an output device, to calculate the remaining thickness, amount removed, and polishing rate from the spectral intensity measurements, and/or to detect the polishing endpoint. The computing device 48 also can be configured to cause, for example, the polishing rate and polishing time of the polishing apparatus to be selected or adjusted based upon the received light signals in the light detector 46.

The computing device 48 can include a storage device containing reference database for transmission and thickness/phase correlations at various frequencies. The database can contain data in lookup tables, mathematical formulae, spectra graphs, or simulation models against which intensity measurements from the light detector can be matched or compared in determining the thickness or phase of a GST film.

The factory interface 100 can also include a pre-aligner 210 to position the substrate in a known rotational position. The pre-aligner 210 includes a rotatable support 212, such as a pedestal, possibly with a vacuum or electrostatic chuck, an edge support ring, or support pins, onto which the substrate can be placed. In addition, the pre-aligner 210 includes a notch detection system, such as an optical interrupter sensor 220, to sense when the substrate notch is at a specific angular position. Substrates which might be in an uncertain angular position, e.g., after a polishing operation, have a known orientation when scanned by the in-line metrology/monitoring system 200, thus permitting accurate determination of the x-y (or r-θ) position of the measurements on the substrate. Because the position of the transmission measurements is known with higher accuracy, the reliability of the association of transmission measurements with substrate characteristics is improved.

Optionally, the metrology system 200 can include additional other sensor elements in addition to the light detector, such as an eddy current sensor, of a monochromatic interferometric optical sensor.

Optionally, the in-line metrology system could be housed in a separate module 160 connected to the factory interface module 100. For example, one of the side walls 104 or 106 (side wall 106 in the implementation shown in FIG. 1) mates with a wall 161 of the metrology module 160 and shares an access port 124. The side wall 104 and the monitoring system wall 161 may be combined into one structure, and there may be additional ports from the factory interface module 100 to the metrology module 160. The metrology module 160 could include a separate robot for the substrate, or the factory interface robot 130 could manipulate the substrate, to cause the substrate to be scanned past the spectrographic probe.

Returning to FIGS. 2 and 3, the in-line metrology/monitoring system 200 can be utilized as follows. During processing of device substrates, e.g., in a normal polishing operation, an unpolished substrate is retrieved by the factory interface robot 130 from one of the cassettes 112. The factory interface robot 130 "picks" up the substrate, e.g., by vacuum suction, and transports the unpolished substrate at relatively high speed past the optical fibers tips 204 and 206 of the in-line monitoring system 200 in the factory interface. Thus, the robot 130 acts as the stage to hold the substrate during the measurement process. The in-line monitoring system 200 measures transmission spectra or transmission intensity at a selected frequency for a sequence of points across the substrate as the substrate is scanned, and a layer thickness measurement is generated for at least some of the measured points by the computing device 48. These pre-polish layer thickness measurements can be used to adjust the polishing parameters for the substrate.

The robot 130 then transports the substrate through the entry port 120 to the staging section 176. There, the substrate is placed in either the pass-through support 180 or the indexible buffer 182. The wet robot 140 then extracts the substrate 10 from the staging section 176 and places the substrate 10 into the transfer station 152 of the polishing apparatus 20. From the transfer station 152, the substrate 10 is carried to one or more polishing stations 150 to undergo chemical mechanical polishing according to the polishing parameters selected. After polishing, the wet robot 140 transports the substrate 10 from the transfer station 152 to the walking beam 184 in the cleaner 170. The walking beam 184 transports the substrate through the cleaner section 178 of the cleaner 170. While the substrate 10 is transported through the cleaner section 178, slurry and other contaminants that have accumulated on substrate surface during polishing are removed.

The factory interface robot 130 then removes the substrate 10 from the cleaner 170 through the exit port 122, and transports the polished substrate at relatively high speed past the optical fiber tips of the in-line metrology/monitoring system 200 in the factory interface 100. Again, the in-line monitoring system 200 measures transmission spectra or transmission intensity at a single selected frequency for a sequence of points across the substrate as the substrate is scanned, and a layer thickness measurement is generated for at least some of the measured points. These post-polish layer thickness measurements can be used to adjust the polishing process parameters for a subsequent substrate. Finally, the factory interface robot 130 returns the substrate 10 to one of the cassettes 12.

Due to the high speed of the in-line measurements, e.g., a velocity of about 150-350 mm/sec during many measurements, during production each and every substrate can undergo both pre-polish and post-polish measurement without impacting substrate throughput (for throughput <85 wafer per hour). Thus, for each substrate, thickness measurements at a variety of radial positions on the substrate can be used to control processing conditions for that substrate or for a subsequent substrate. In some implementations, measurements can be done on substrates in-between platens, further refining the polishing process.

In some implementations, based on the current spectra of each region on a sample substrate and the variations thereof, the computing device 48 can determine the flatness of the wafer and the polishing uniformity for CMP tool and process qualification. For example, the computing device 48 can applies process control and endpoint detection logic to determine when to change process and polish parameters and to detect the polishing endpoint. Possible process control and endpoint criteria for the detector logic include local minima or maxima, changes in slope, threshold values in amplitude or slope, or combinations thereof. In some implementations, spectra of transmitted light through a sample wafer can be frequently monitored and collected as polishing progresses, and the computing device 48 can determine appropriate process control and endpoint of a polishing process.

Figure 4:
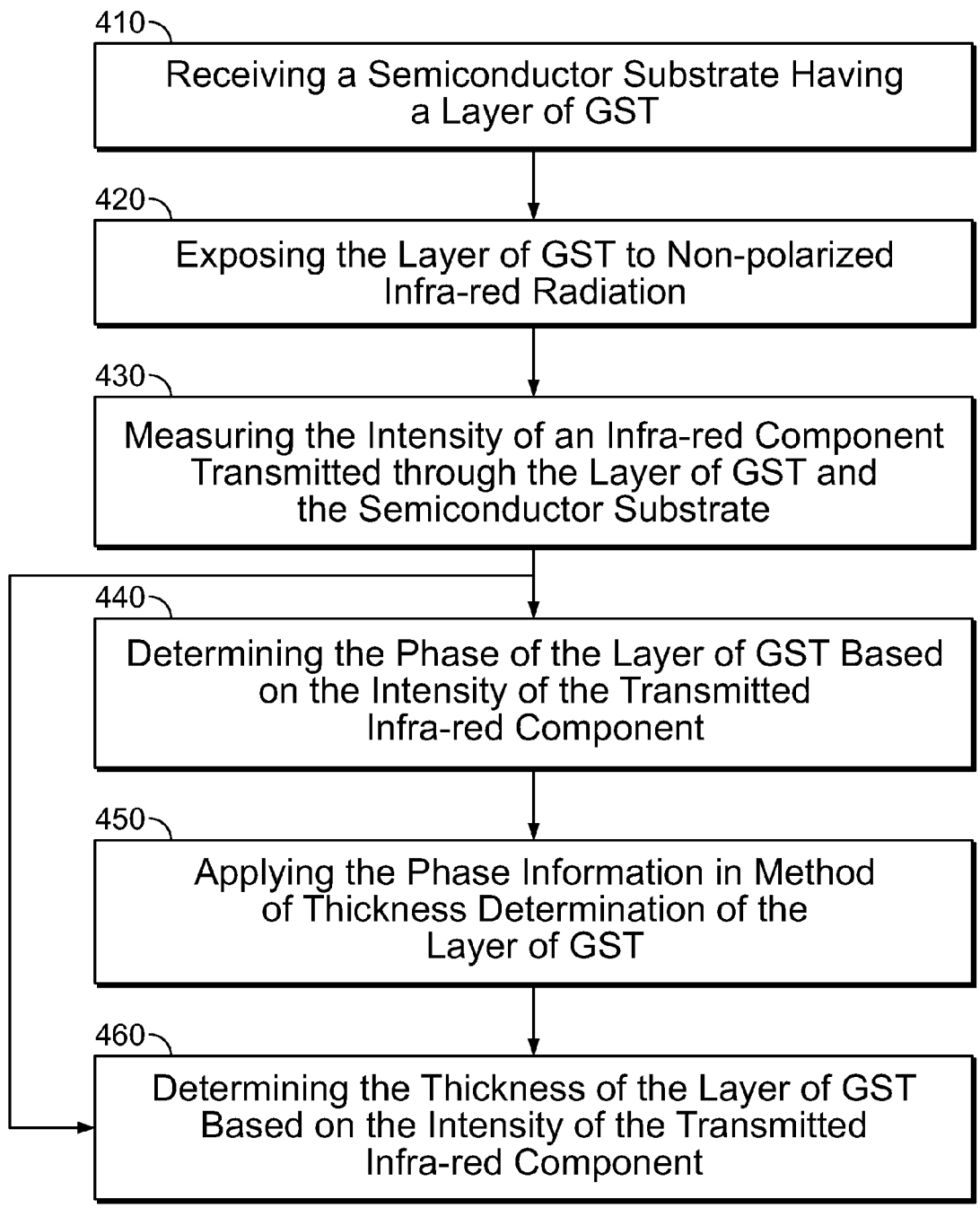
FIG. 4 shows an example process for determining a thickness of a GST layer based on its transmission property in the infra-red range.

FIGS. 4-7 illustrate some example processes for GST thickness and/or structural phase based on its infra-red transmission properties. FIG. 4 shows an example process for thickness and/or structural phase determination based on an intensity of a transmitted infra-red component. The process includes a step 410 of receiving a semiconductor substrate with a layer of GST, a step 420 of exposing the layer of GST to an incident non-polarized infra-red radiation, a step 430 of measuring an intensity of an infra-red component transmitted through the layer of GST and the semiconductor substrate, and a step 460 of determining the thickness of the GST layer based on the measured intensity of the transmitted infra-red component. Alternatively, following the step 430 of measuring the intensity of the transmitted infra-red component, a step 440 of determining a structural phase of the layer of GST based on the measured intensity of the transmitted infra-red component can be performed. In addition, a step 450 of applying the phase information determined in step 440 or received through other means to the method of thickness determination can be performed. And finally, GST thickness can be determined based both on the measured intensity of the transmitted infra-red component and the structural phase information.

In some implementation, the thickness and structural phase determination is based on a transmission coefficient. The transmission coefficient is defined as the intensity ratio between the transmitted infra-red component and corresponding incident infra-red component. The intensity ratio can be found for a whole spectrum of frequencies (for example, as a function of frequency or a frequency band), or just a few discrete frequencies during a GST thickness and/or phase determination.

In some implementations, the above steps can be performed in an in-line or a standalone metrology/monitoring station. The semiconductor substrate received can have a layer of GST either patterned or uniformly deposited. In some implementations, the incident radiation can be a continuous wave. In some implementations, a pulse having infra-red frequency components can be used. In some implementations, the layer of GST is exposed to broadband radiation, and only intensities in the infra-red ranged is measured. In some implementations, the layer of GST is exposed to a broadband infra-red radiation, and intensity of the entire spectrum of transmitted light is measured. In some implementations, the layer of GST is exposed to a broadband infra-red radiation, and only intensities at one or more specific frequencies are measured. In some implementations, the incident infra-red radiation is of a single frequency, and intensity of the transmitted light is measured. In some implementations, broadband radiation is used and broadband intensity spectrum is measured, while the determination of thickness and/or phase is based on the data for one or more specific frequencies only.

In some implementations, using broadband radiation and measuring broadband intensity spectrum reduces the need to reconfigure the light source and light detector for different GST thickness ranges, and the determination of phase and thickness can be accomplished by using only data points at selective frequencies particularly suitable for the GST layer currently being measured. The selection of suitable frequencies is discussed in further detail with respect to FIGS. 9-10.

Figure 5:
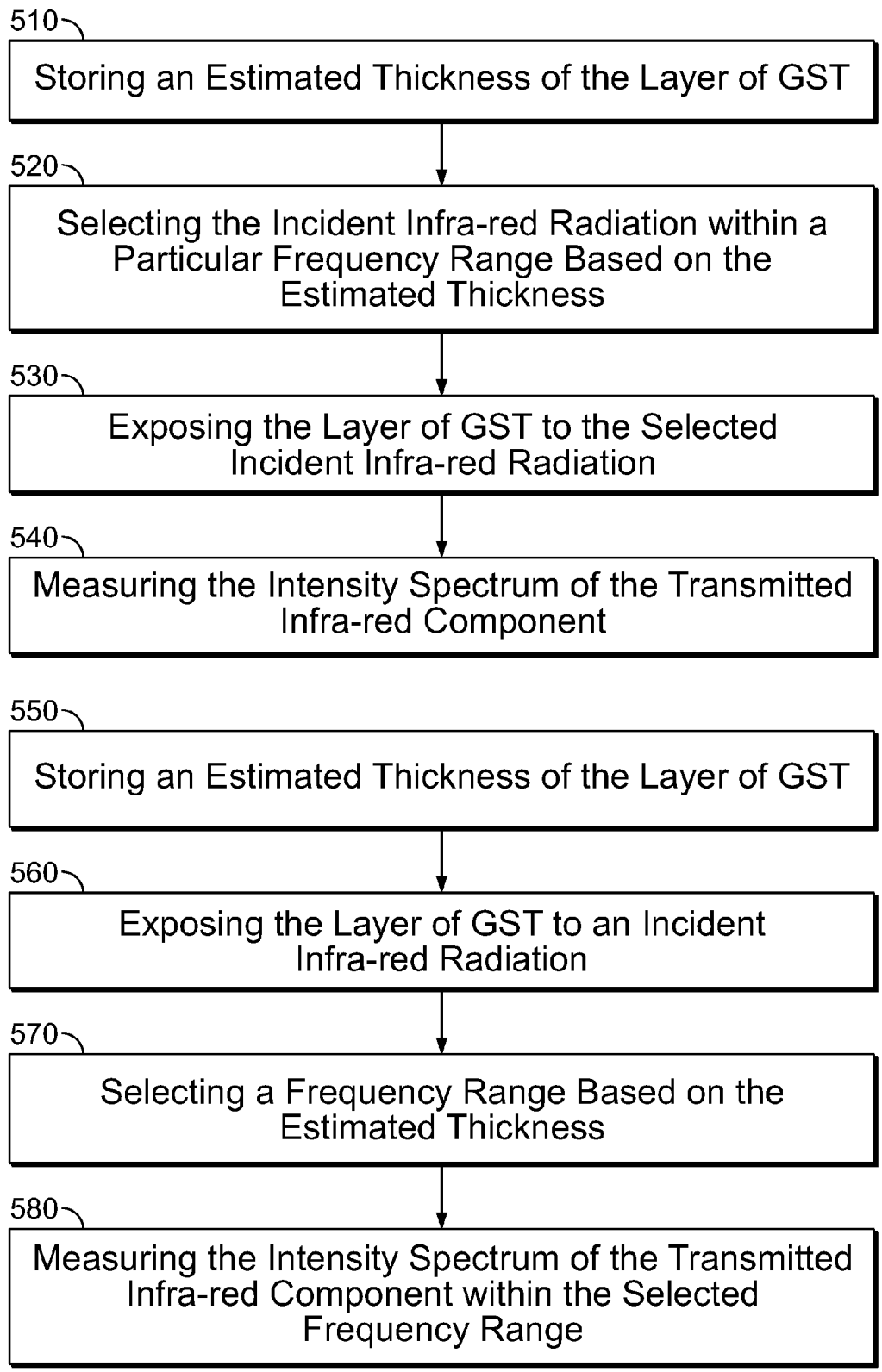
FIG. 5 shows two example processes for selecting a frequency range for GST film thickness or structural phase determination.

FIG. 5 shows two example processes for selecting a frequency range for GST film thickness or structural phase determination. Suitable frequencies or frequency ranges can be selected based on estimated thicknesses or target thicknesses of the GST layer. The frequency or frequency range selection can apply to any of three steps: selecting frequencies for the incident radiation, selecting frequencies for intensity measurements, or selecting one or more (intensity, frequency) data point from an intensity spectrum for thickness determination.

Figure 9:
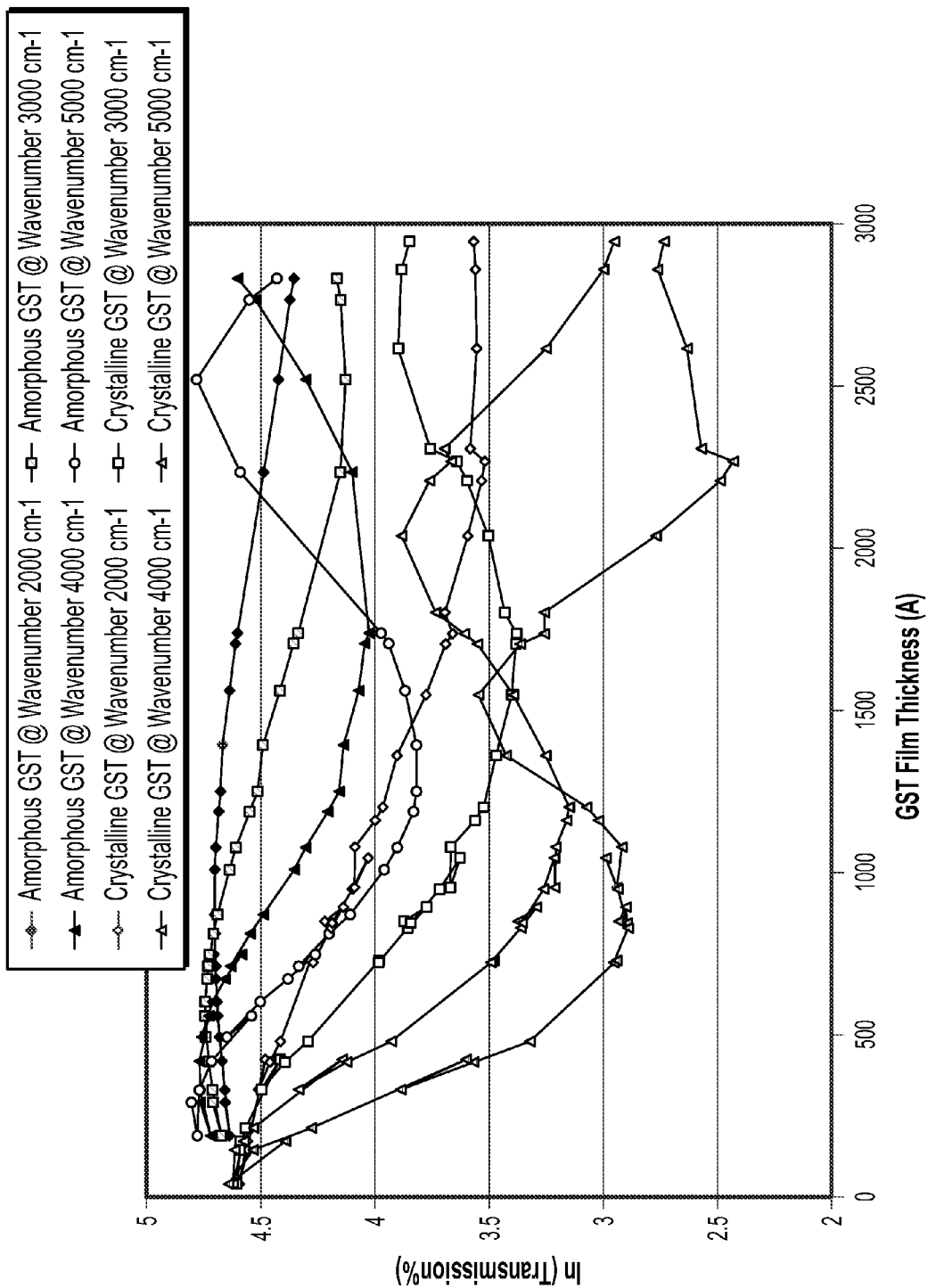
FIG. 9 shows correlation between Ln(Transmission %) and GST film thickness at three example infra-red wavelengths for both crystalline and amorphous state GST.
Figure 10:
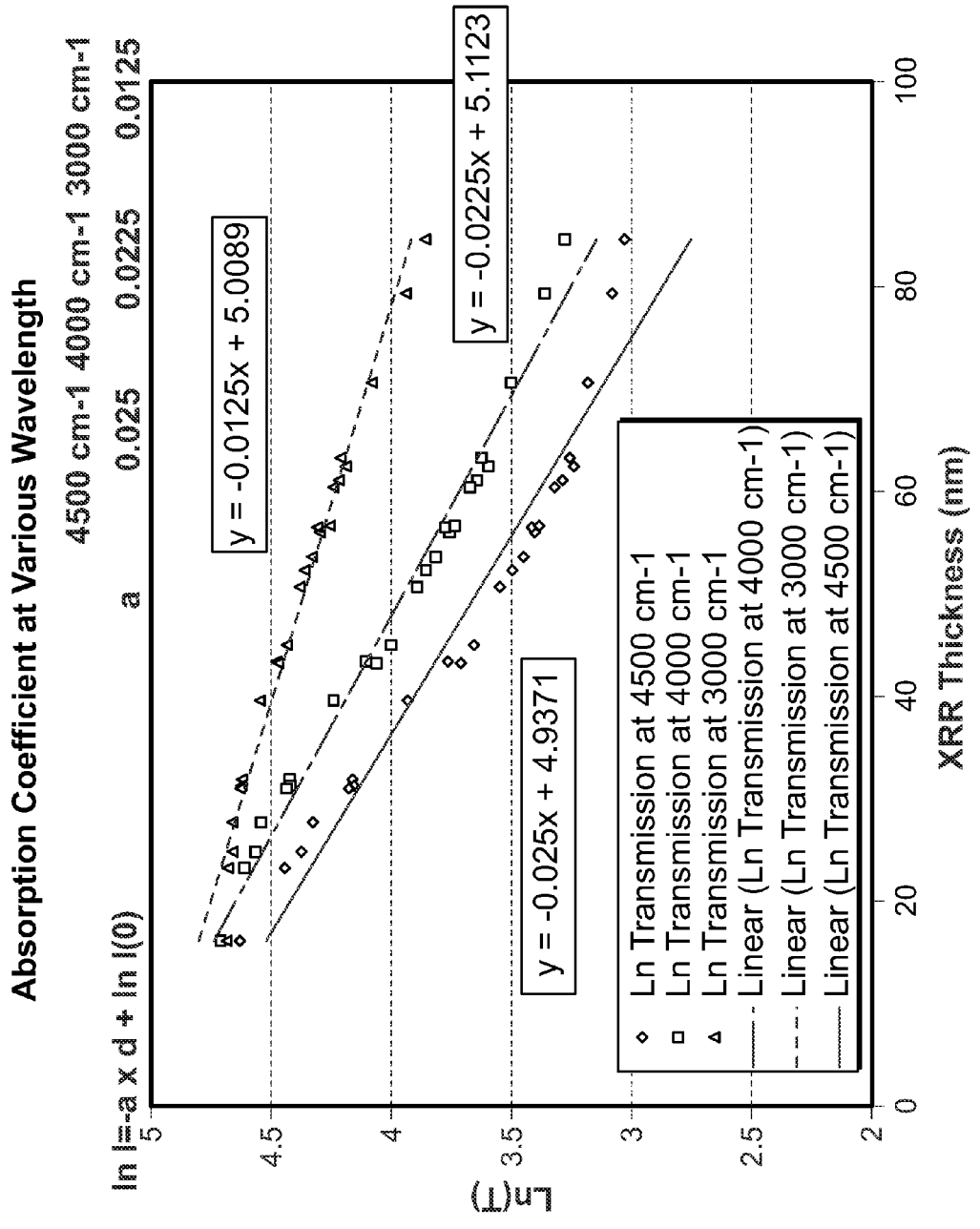
FIG. 10 shows correlation between Ln(Transmission %) and GST film thickness at three example infra-red wavelengths within a thickness range.

Selection of suitable frequencies for GST thickness and/or phase determination is further discussed with respect to FIGS. 9-10. The basic idea is that because transmission intensity varies with GST film thickness, in order to better monitor changes in film thickness during polishing, it is desirable to select a frequency range where the transmission intensity is more sensitive to the changes in GST thickness. Furthermore, depending on the relative size of the incident wavelength and the GST film thickness, transmission may go through local peaks or valleys at certain thicknesses for a given incident wavelength. Consequently, a single transmission intensity value can correspond to multiple thicknesses around the transmission peaks and valleys. Therefore, in some implementations, it is desirable to avoid selecting frequencies that give rise to local peaks and valleys near the estimated or target thicknesses.

The first example process shown in FIG. 5 includes a step 510 of storing an estimated thickness of a GST layer, a step 520 of selecting the incident infra-red radiation within a particular frequency range based on the estimated thickness, a step 530 of exposing the layer of GST to the selected incident infra-red radiation, and a step 540 of measuring the intensity spectrum of the transmitted infra-rd component.

The second example process shown in FIG. 5 includes a step 550 of storing an estimated thickness of the layer of GST, a step 560 of exposing the layer of GST to an incident infra-red radiation, a step 570 of selecting a frequency range based on the estimated thickness, and a step 580 of measuring the intensity spectrum of the transmitted infra-red component within the selected frequency range.

Both example processes can be followed by a determination of the thickness and/or structural phase based on the measured intensity spectrum. In addition, in both processes, instead of storing an estimated pre-polishing thickness of the layer of GST, the selection of frequency range of interest can be based on a target thickness of the GST layer.

In both processes, the selection can be done prior to assembling the metrology system, or the selection can be implemented using the computing device that controls the light source and light detector, or the selection can be implemented as instructions in the computing device in the step of determining thickness and/or phase based on the intensity measurements received.

Figure 6:
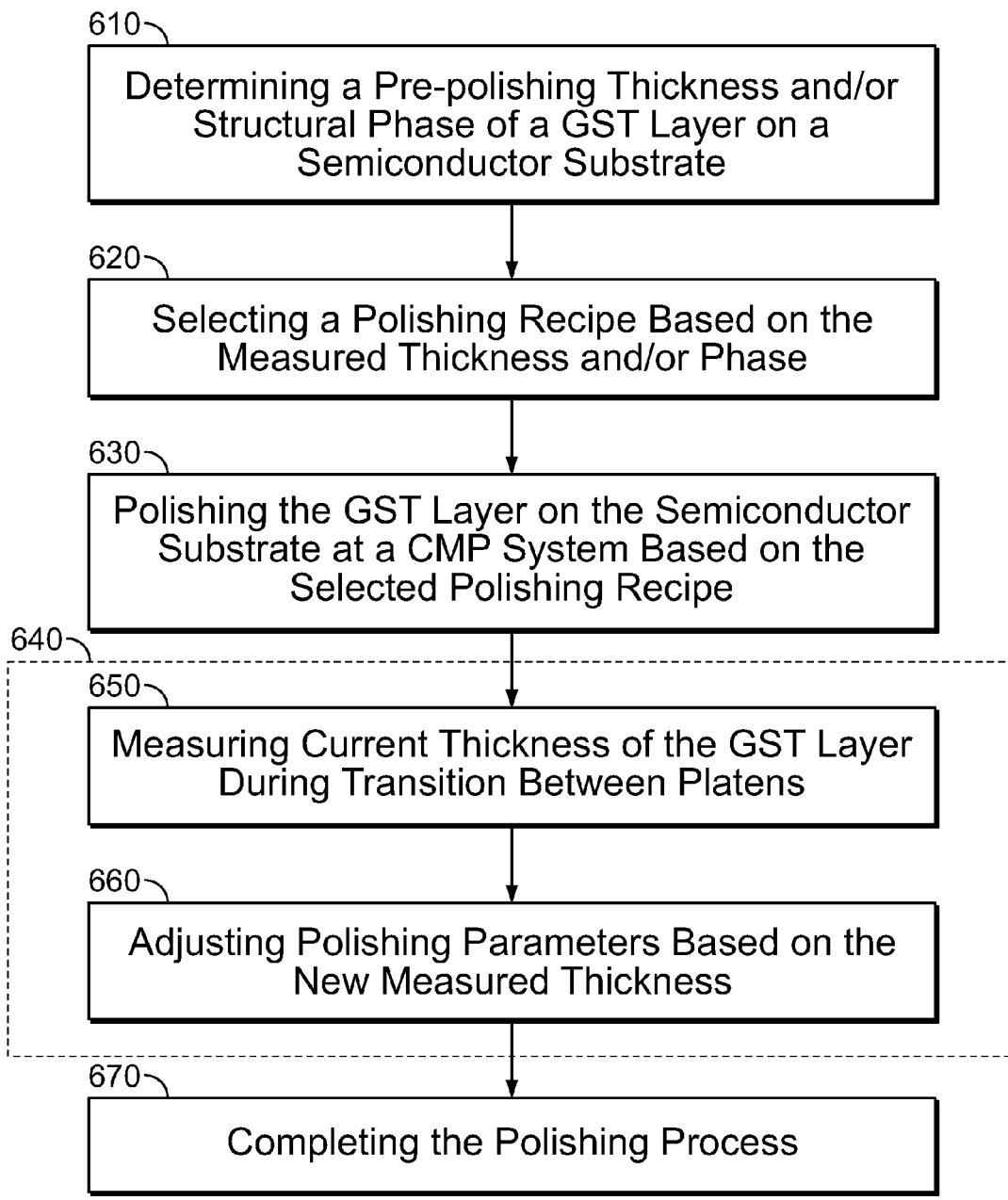
FIG. 6 shows an example process for thickness determination and monitoring pre- and between processing.

FIG. 6 shows an example process for thickness measurement and monitoring pre- and between processing using the present technique. The process can be performed in an in-line or standalone metrology station of a CMP system. The process includes a step 610 of determining a pre-polishing thickness and/or structural phase of a GST layer on a semiconductor substrate, a step 620 of selecting a polishing recipe based on the measured thicknesss and/or structural phase, and a step 630 of polishing the GST layer at a CMP station according to the selected polishing recipe.

A polishing recipe typically includes parameters to control the CMP system, such as downward pressure applied by each polishing head, the rotational speed of each polishing head, and/or the oscillation of each polishing head. The above identified parameters may be varied and is not intended to be exhaustive. Those skilled in the art will readily appreciate that, in using the present invention, any variable affecting the polishing recipe may be varied achieve control of the polishing operation.

The above process can be carried out for each individual wafer to be processed. Alternatively, the thickness and phase determination can be done for a sample wafer during qualification of the polishing system, and the selected polishing recipe is used for all subsequent wafers of the same design during production. In some implementations, the step 610 can be done for a plurality of locations on the semiconductor substrate to obtain a profile of the substrate, and the polishing recipe is selected based on the entire profile.

Alternative or in addition to measuring a pre-processing thickness of the GST layer, the process can include a set 640 of steps to be carried out during polishing: a step 650 of measuring a current thickness of the GST layer during transition between platens, and a step 660 of adjusting polishing parameters based on the current thickness for polishing at each successive platens before the completion of the final polishing process (step 670). The measured thickness can be compared with a predetermined value and the polishing parameters can be adjusted based on the comparison. During polishing at the last platen, appropriate endpoint can be called based on the measurement done before the polishing at the last platen.

In some implementations, a post-polishing thickness can also be determined, and the polishing recipe or parameters can be further refined based on the post-polishing thickness for the polishing of a subsequent wafer.

FIGS. 7-11 are experimental data showing correlations between transmission intensity through the GST layer, incident frequencies, and GST film thicknesses.

Figure 7:
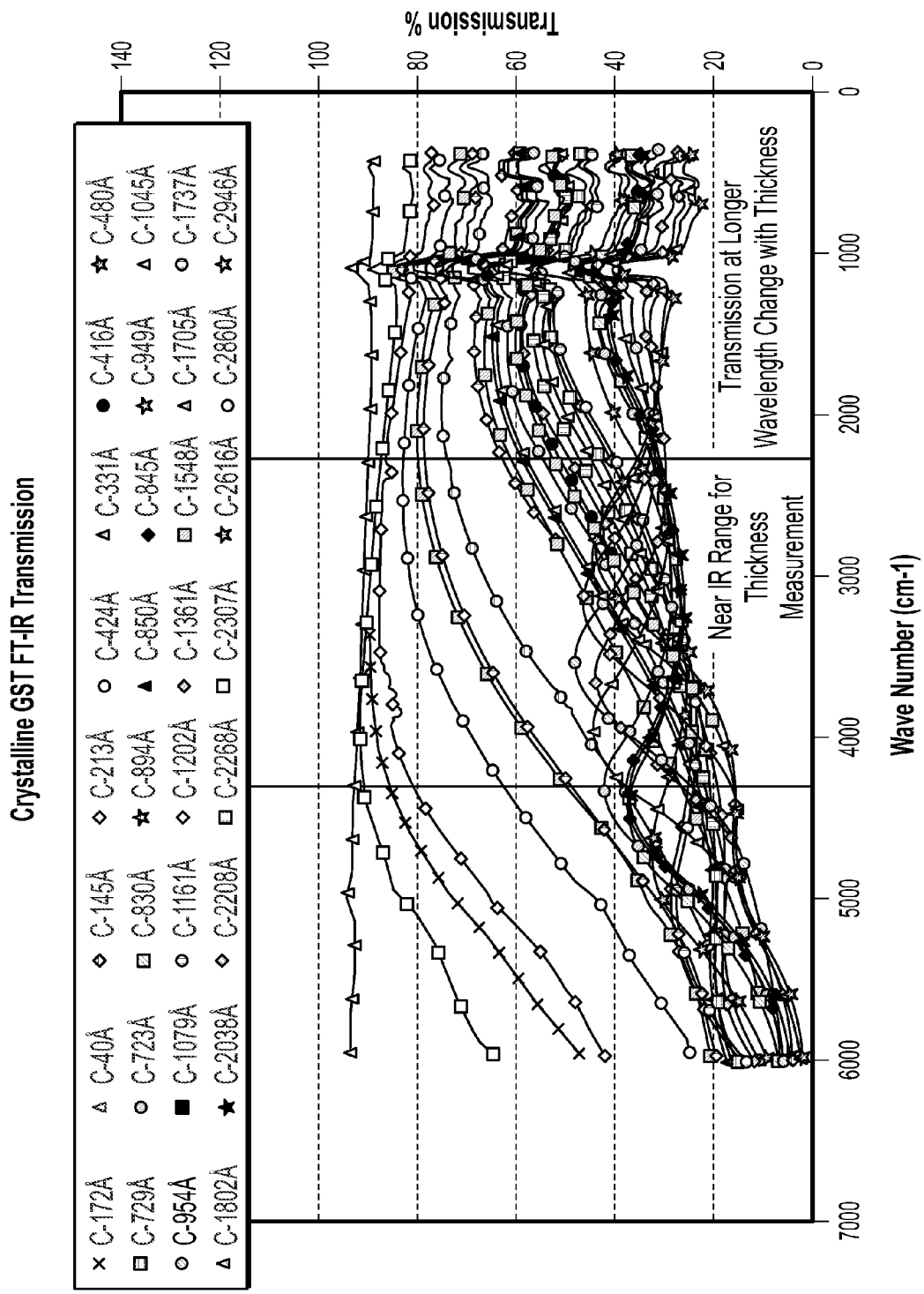
FIG. 7 shows transmission spectra for crystalline GST layers with various example thicknesses.

FIG. 7 shows transmission spectra for crystalline GST layers with various example thicknesses. The horizontal axis of the plot is frequency in terms of wave numbers ($cm^{-1}$) ranging from 0 to 6000. The vertical axis of the plot is transmission intensity as a percentage of the incident intensity, namely transmission coefficient. A number of transmission spectra lines of GST films with thicknesses ranging from 40 Angstroms to 2946 Angstroms are each represented in the plot.

As is shown in the plot, for crystalline GST, transmission intensity changes with incident frequency for all thicknesses of the GST layer represented in the plot. When GST film thickness is small, for example, at 40 Angstroms, the transmission is almost level at 100%. However, as the film thickness increases, transmission reduces generally with increasing film thickness with the exception of small transmission peaks forming for thicker films at higher frequencies. For example, it can be observed from the plot that small local transmission peaks exist for film thicknesses ranging 1202 Angstroms to 2946 Angstroms, and the local peaks shifts towards lower frequencies with increasing film thickness. Regardless of these local peaks, transmission is sufficiently sensitive to thickness variations within the range of near infra-red radiations (wave numbers between 2200 $cm^{-1}$ to 4400 $cm^{-1}$). Therefore, this range can be chosen to determine GST film thickness according to the present invention, particularly for GST films thicknesses ranging between, for example, 40 Angstroms and 1202 Angstroms. According to the transmission spectra, other frequency ranges can be chosen for other GST film thicknesses. For example, for GST film thickness from 40 Angstroms to 480 Angstroms, the transmission response is sufficiently sensitive to incident radiations with frequencies ranging from 4500 $cm^{-1}$ to 6000 $cm^{-1}$. Specific implementations of the present invention can choose a frequency range that would be able to provide sufficient thickness resolution for all potential thicknesses that would be measured under those particular situations. In some implementations, frequencies ranging from 2000 $cm^{-1}$ to 6000 $cm^{-1}$ can be chosen.

Figure 8:
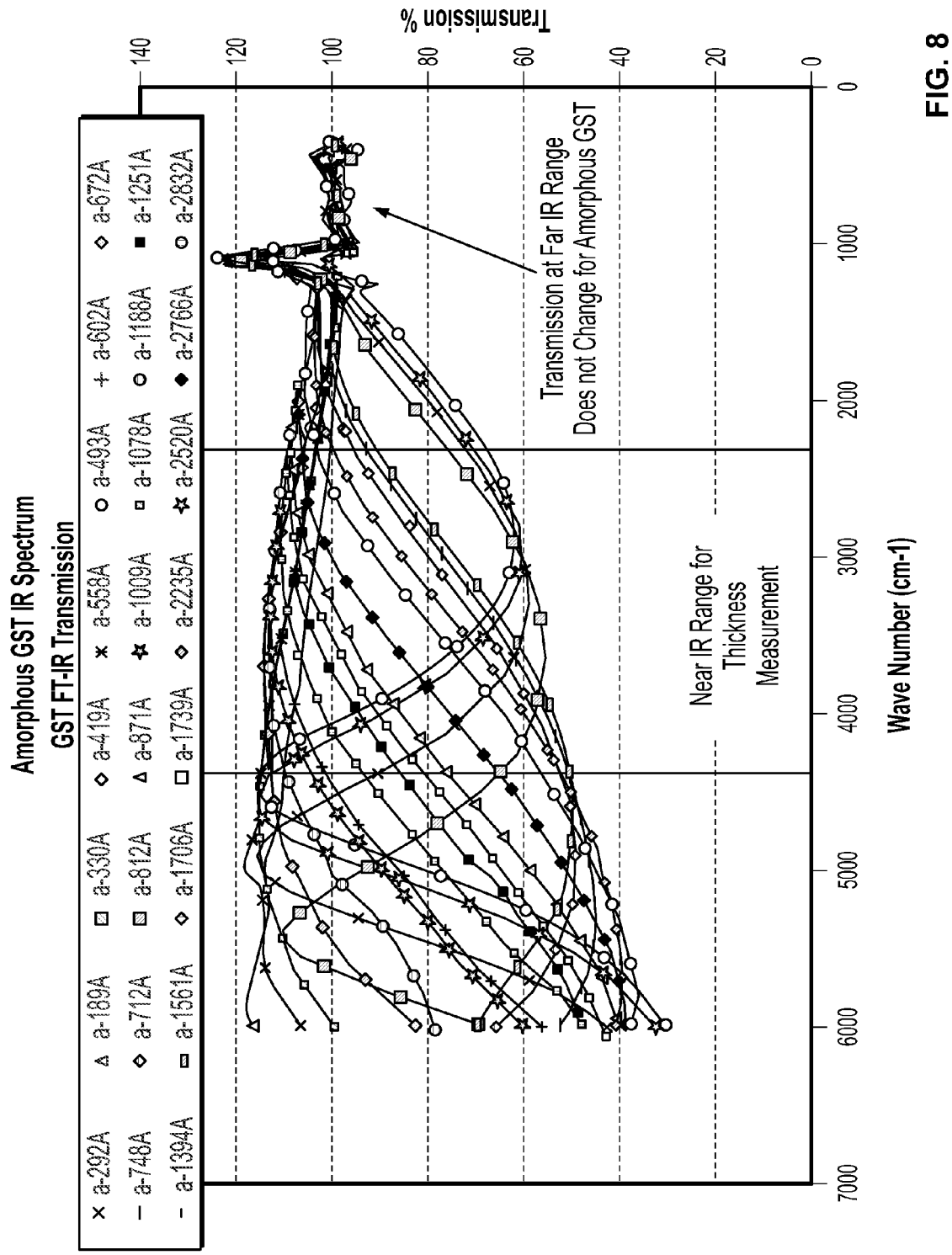
FIG. 8 shows transmission spectra for amorphous GST layers with various example thicknesses.

FIG. 8 shows transmission spectra for amorphous GST layers with various example thicknesses. The horizontal axis of the plot is frequency in terms of wave numbers (cm–1) ranging from 0 to 6000. The vertical axis of the plot is transmission intensity as a percentage of the incident intensity, namely transmission coefficient. A number of transmission spectra lines of GST films with thicknesses ranging from 189 Angstroms to 2832 Angstroms are each represented in the plot.

This figure shows the correlations between transmission, frequency, and GST film thickness for amorphous GST. In contrast to the transmission spectra for the crystalline state, transmission spectra for amorphous GST films do not vary significantly for the frequency range between 500 $cm^{-1}$ to 2000 $cm^{-1}$. Transmission intensity for amorphous GST film thickness do vary significantly with incident frequencies in range between 2200 $cm^{-1}$ to 4400 $cm^{-1}$). Therefore, a suitable frequency range that can be used for thickness determination of both crystalline and amorphous state GST is in the near infra-red range (2200 $cm^{-1}$ to 4400 $cm^{-1}$) of the infra-red spectrum. Accordingly, the present invention can be practiced with incident radiations having components in that range, or with intensity measurements taken for frequencies within that range, or with intensity data points chosen within that range for the thickness determination.

FIG. 9 shows correlation between GST film thickness and Ln(Transmission %) at different infra-red frequencies for both crystalline and amorphous state GST films. As shown in the plot, for a given frequency, transmission varies with GST film thickness for both crystalline and amorphous GST. For a given thickness, transmission varies depending on the frequency of the incident radiation. In addition, the transmission intensity variations with respect to thickness behave differently for crystalline and amorphous GST. In general, the amorphous GST has higher transmission than the crystalline GST of the same thickness and at the same frequency.

Based on this plot, if a GST film of unknown thickness and/or phase is irradiated with an incident radiation of known frequency or frequencies for which transmission-thickness correlation data has been obtained via other means (e.g., by XRR), then when transmission intensities are measured for those frequencies, the thickness of the GST film as well as its structural phase can be determined by finding a corresponding data points for those frequencies and transmission intensities.

For example, if one exposes a GST film to radiation at frequency=5000 $cm^{-1}$, and measures a transmission through the GST film, one would be able to find a corresponding data point on the plot that correspond to one or more thicknesses. If the transmission-thickness line is monotonic within the range of an estimated thickness for the GST film (e.g., thickness between 0-500 Angstroms), then a single intensity measurement (e.g., Ln(transmission %)=4.0) would suffice to determine the thickness of the GST film as well as its structural phase (e.g., thickness=300 Angstroms, phase=crystalline). However, if the transmission-thickness curve has one or more local maxima or minima within the range of an estimated thickness (e.g., estimated thickness between 0-2000 Angstroms), then one or more additional data point is need to determine the thickness and phase.

Because there is a possibility where a single transmission intensity can correspond to multiple thicknesses/phases at different frequencies (as shown in the plot), it is desirable to have an estimated thickness, and select a frequency for transmission intensity measurements which increases or decreases monotonically near the estimated thickness. For example, for GST film thicknesses in the range between 200 Angstroms to 700 Angstroms, the transmission decreases monotonically with increasing film thickness when irradiated with light having a frequency of 5000 $cm^{-1}$. If an estimated GST film is within that range, one can select an incident radiation having a frequency at 5000 $cm^{-1}$, measure transmission intensity at that frequency, and find a corresponding thickness and phase for that GST film with a single measurement. An additional benefit of this frequency that transmission is relatively sensitive to thickness changes under this frequency as compared to other frequencies, i.e., the transmission-thickness curve has a steeper slope in this thickness range. For another example, when the estimated thickness is within the range of 1000 Angstroms to 1700 Angstroms, a suitable frequency for thickness determination and phase can be at 3000 $cm^{-1}$.

A simple implementation for thickness determination is by creating a database for transmission-thickness correlations for a number of frequencies and for both the crystalline and amorphous phases using other methods such as ellipsometry or X-ray reflectometry (XRR), and then achieve faster thickness and phase determination for GST films by matching transmission data against the database. Alternatively, the database can be created using computer simulations, or theoretical computations based on various models, or combinations thereof. Alternatively, libraries of spectra graphs can be created using the above methods, and intensity measurements or intensity spectra can be matched against the spectra graphs in the library to determine GST thickness and/or phase.

Because thickness-frequency correlation of GST films depends on the structural phase of the GST film. The structural phase information can be used to select an appropriate approach or dataset for the thickness determination. For example, in one process to determine thickness, if the structural phase of a GST film has already been determined based on its infra-red transmission property or known through other means, an appropriate transmission-frequency correlation dataset for only that structural phase can be utilized, thus reducing the need to resolve ambiguities due to different structural phases and sub-phases.

FIG. 10 shows correlation between crystalline GST film thickness and Ln(transmission %) at three different infra-red wavelengths within a thickness range. Because the correlation in this thickness range (20 nm-90 nm) is monotonic, and almost linear, a simple mathematical relationship can be established for thickness determination within this thickness range.

For example, given that the phase of a GST film is known to be crystalline, irradiating the GST film at any of the frequencies shown (3000 cm$^{-1}$, 4000 cm$^{-1}$, and 4500 cm$^{-1}$), a thickness can be calculated by based on a linear equation with a known slope and Ln(transmission %) intercept. This is a simpler alternative process to matching data against a database of transmission-thickness-frequency data or a library of transmission spectra.

Figure 11:
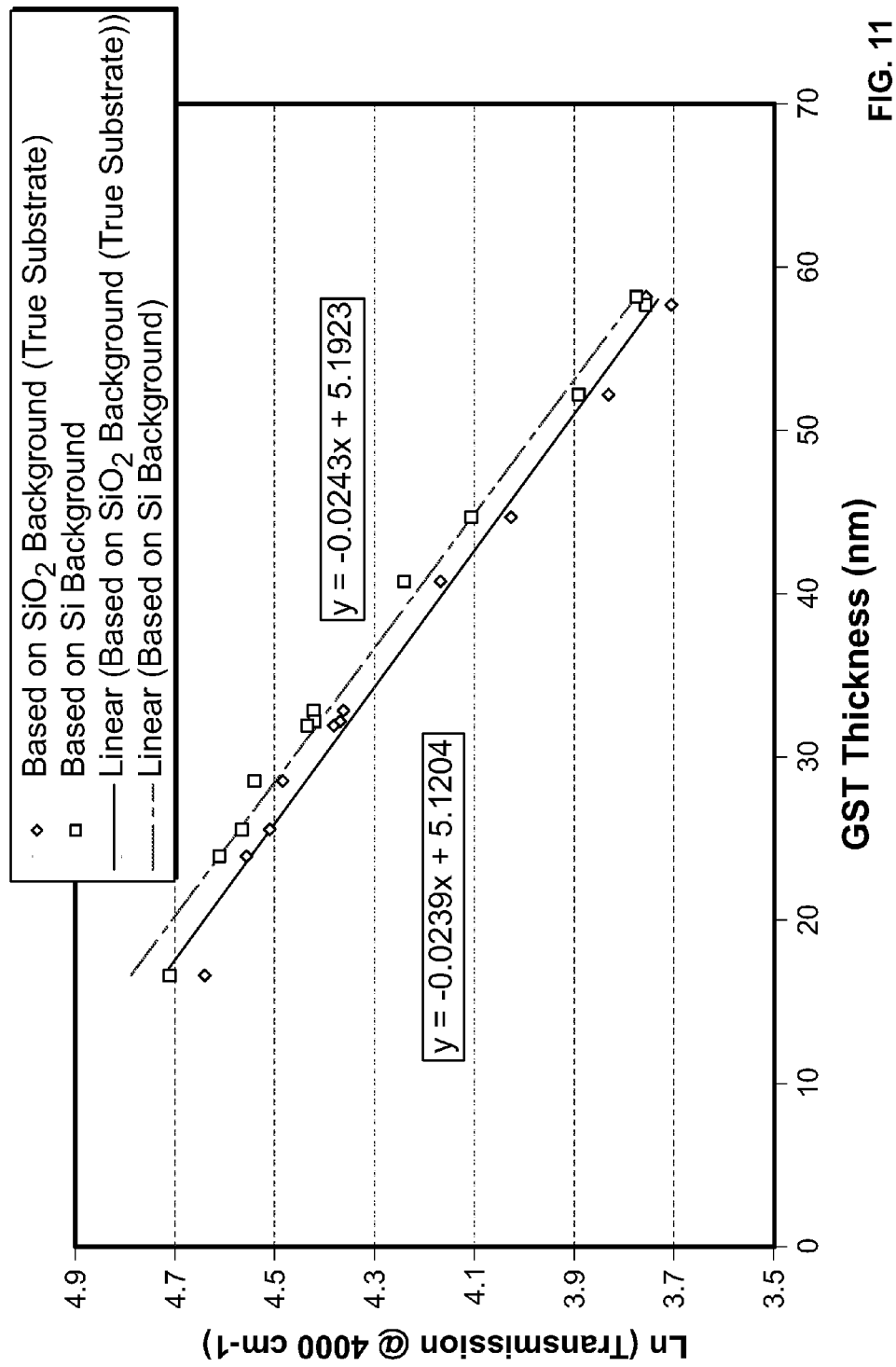
FIG. 11 shows effect of background infra-red spectrum due to substrates on the GST Ln(transmission %)-thickness correlation.

FIG. 11 shows the effect of background infra-red spectrum on the GST transmission-thickness correlation. The data is for GST film thickness within 15 nm-60 nm range where the Ln(transmission %) is linearly related to thickness for the given frequency (4000 cm$^{-1}$). The plot shows that the slope and the Ln(transmission %) intercept is not significantly affected by the presence of a substrate, SiO2 or Si. This illustrates that the substrate is substantially transparent in the frequency range used for GST film thickness and phase determination; therefore, this would result in accurate determination regardless of the presence of the substrate.

The subject matter described herein contemplates a comprehensive thin-film metrology and polishing system, which combines measurements of patterned wafers irrespective of locations of the measurements. It offers in-line measurements (i.e. performed within a semiconductor fabrication tool) and also rapid multi-point (i.e. mapping) measurements of film thickness and phase properties. The present concepts can be applied broadly to many semiconductor fabrication tools.

In another implementation, the polishing of GST can be optically monitored in-situ, i.e., during the polishing process. Based on the progress of polishing as measured at multiple locations across a first substrate, polishing parameters can be modified for a subsequent substrate in order to improve polishing uniformity. In-situ monitoring of polishing of GST can be performed in a reflection mode, e.g., a interferometric mode. In the interferometric mode, a light beam is directed toward the GST layer from side of the layer being polished, and is reflected from both the outer surface of the GST and from the underlying layer, creating an interference effect such that the reflected light intensity depends on the layer thickness.

Figure 12:
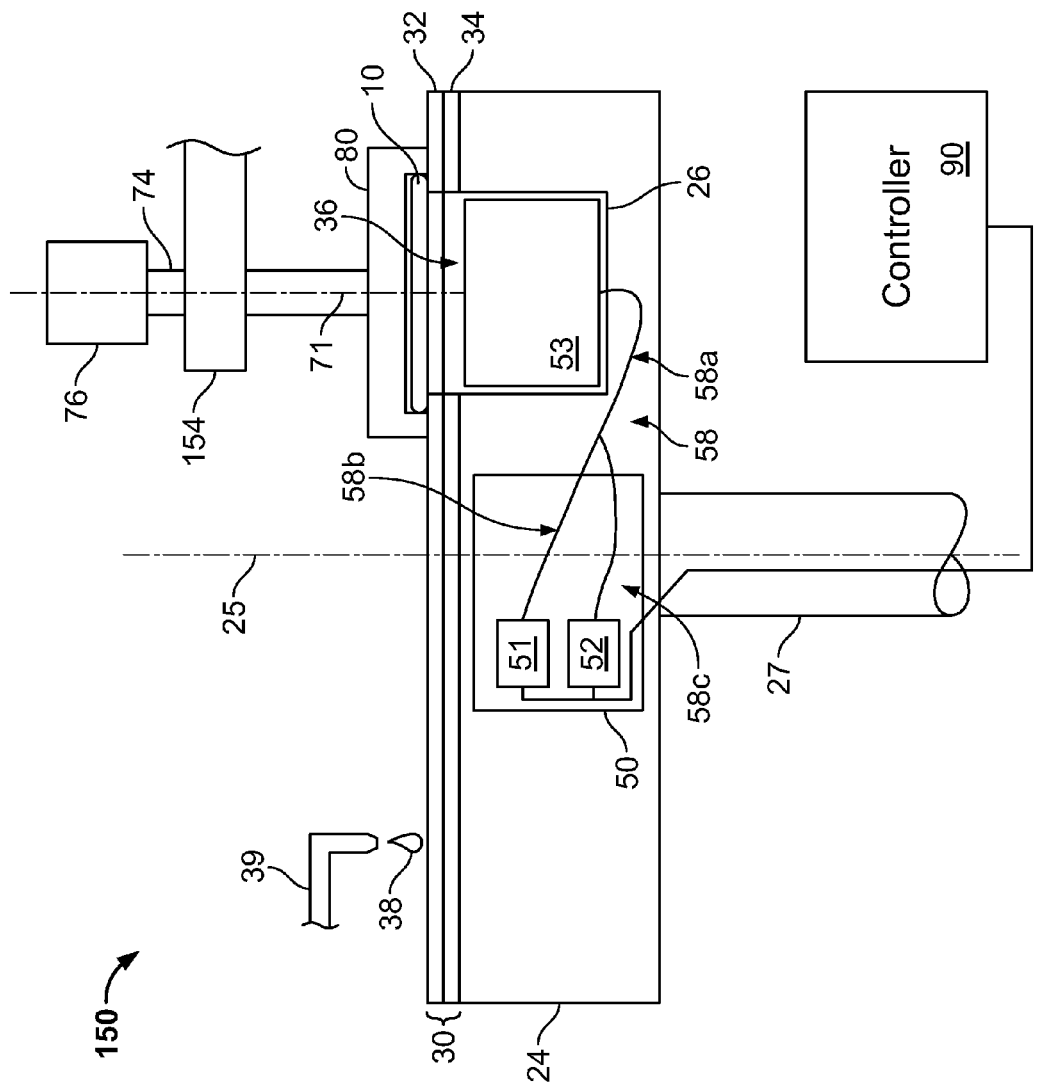
FIG. 12 shows a schematic cross-sectional view of a polishing station.

FIG. 12 is a schematic cross-sectional view of a chemical mechanical polishing station 150 operable to polish the substrate 10. The polishing station 150 includes a rotatable disk-shaped platen 24, on which a polishing pad 30 is situated. The platen 24 is operable to rotate about an axis 25. For example, a motor (not shown) can turn a drive shaft 27 to rotate the platen 24. The polishing pad 30 can be detachably secured to the platen 24, for example, by a layer of adhesive. When worn, the polishing pad 30 can be detached and replaced. The polishing pad 30 can be a two-layer polishing pad with an outer polishing layer 32 and a softer backing layer 34.

The polishing station 150 can include a combined slurry/rinse arm 39. During polishing, the arm 39 is operable to dispense slurry 38, e.g., a liquid with abrasive particles. Alternatively, the polishing station 150 includes a slurry port operable to dispense polishing slurry onto polishing pad 30.

The polishing station 150 also includes the carrier head 80 that is operable to hold the substrate 10 against the polishing pad 30. The carrier head 80 is suspended from a support structure, for example, the carousel 154, and is connected by a carrier drive shaft 74 to a carrier head rotation motor 76 so that the carrier head can rotate about an axis 71. In addition, the carrier head 80 can oscillate laterally in a radial slot formed in the support structure. In operation, the platen 24 is rotated about its central axis 25, and the carrier head 80 is rotated about its central axis 71 and translated laterally across the top surface of the polishing pad 30.

Figure 13:
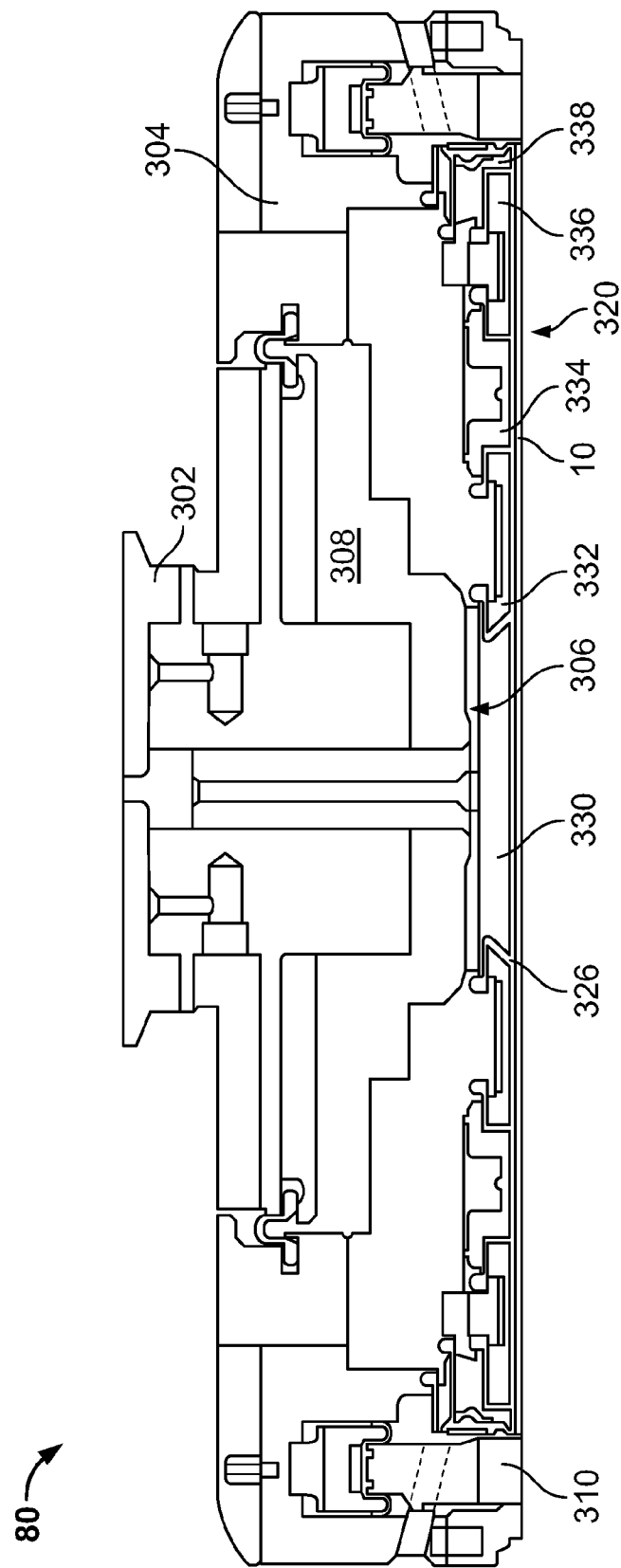
FIG. 13 shows a schematic cross-sectional view of a carrier head.
Figure 14B:
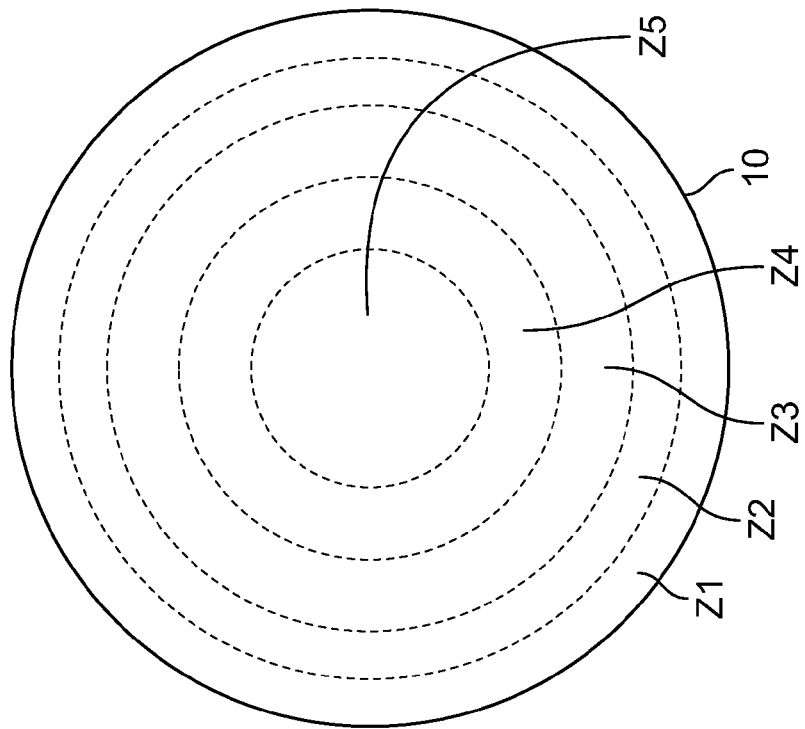
FIG. 14B shows concentric zones on a substrate.

Referring to FIG. 13, the carrier head 80 can include multiple chambers in order to apply independently controllable pressures to multiple regions, e.g., concentric regions, on the substrate. In one implementation, the carrier head 80 includes a housing 302, a base assembly 304, a gimbal mechanism 306 (which can be considered part of the base assembly 304), a loading chamber 308, a retaining ring 310, and a substrate backing assembly 320 which includes a flexible membrane 326 that defines multiple independently pressurizable chambers, such as an inner chamber 330, a middle chambers 332, 334, 336, and an outer chamber 338. These chambers control the pressure on concentric regions of the flexible membrane, thus providing independent pressure control on concentric portions of the substrate 10. In some implementations, the carrier head 80 includes five chambers and a pressure regulator for each of the chambers. For example, referring to FIG. 14B, the five chambers 330, 332, 334, 336, and 338 can control the pressure applied to five concentric zones Z1, Z2, Z3, Z4 and Z5 on the substrate 10.

Returning to FIG. 12, the polishing station 150 also includes an optical monitoring system, which can be used to determine a polishing endpoint as discussed below. The optical monitoring system includes a light source 51 and a light detector 52. Light passes from the light source 51, through the polishing pad 30, impinges and is reflected from the substrate 10 back through the polishing pad, and travels to the light detector 52.

Optical access through the polishing pad 30 is provided by including an aperture (i.e., a hole that runs through the pad) or a solid window 36. The solid window can be secured to the polishing pad 30, although in some implementations the solid window 36 can be supported on the platen 24 and project into an aperture in the polishing pad 30. In some implementations the solid window 36 is secured in the polishing pad 30 and is a polyurethane window. The polishing pad 30 is usually placed on the platen 24 so that the aperture or window overlies an optical head 53 situated in a recess 26 in the top surface of the platen 24. The optical head 53 consequently has optical access through the aperture or window to a substrate being polished.

A bifurcated optical cable 58 can be used to transmit the light from the light source 51 to the window 36 and back from the window 36 to the light detector 52. The bifurcated optical cable 58 can include a "trunk" 58a and two "branches" 58b and 58c.

As mentioned above, the platen 24 includes the recess 26, in which the optical head 53 is situated. The optical head 53 holds one end of the trunk 58a of the bifurcated fiber cable 58, which is configured to convey light to and from a substrate surface being polished. The optical head 53 can include one or more lenses or a window overlying the end of the bifurcated fiber cable 58. Alternatively, the optical head 53 can merely hold the end of the trunk 58a adjacent the window in the polishing pad. The optical head 53 can be removed from the recess 26 as required, for example, to effect preventive or corrective maintenance.

The platen 24 includes a removable in-situ monitoring module 50. The in-situ monitoring module 50 can include one or more of the following: the light source 51, the light detector 52, and circuitry for sending and receiving signals to and from the light source 51 and light detector 52. For example, the output of the detector 52 can be a digital electronic signal that passes through a rotary coupler, e.g., a slip ring, in the drive shaft 27 to a controller 90 for the optical monitoring system. Similarly, the light source can be turned on or off in response to control commands in digital electronic signals that pass from the controller 90 through the rotary coupler to the module 50.

The in-situ monitoring module can also hold the respective ends of the branch portions 58b and 58c of the bifurcated optical fiber cable 58. The light source is operable to transmit light, which is conveyed through the branch 58b and out the end of the trunk 58a located in the optical head 53, and which impinges on a substrate being polished. Light reflected from the substrate is received at the end of the trunk 58a located in the optical head 53 and conveyed through the branch 58c to the light detector 52.

In some implementations, the bifurcated fiber cable 58 is a bundle of optical fibers. The bundle includes a first group of optical fibers and a second group of optical fibers. An optical fiber in the first group is connected to convey light from the light source 51 to a substrate surface being polished. An optical fiber in the second group is connected to receive light reflecting from the substrate surface being polished and convey the received light to a light detector. The optical fibers can be arranged so that the optical fibers in the second group form an X-like shape that is centered on the longitudinal axis of the bifurcated optical fiber (as viewed in a cross section of the bifurcated fiber cable 58). Alternatively, other arrangements can be implemented. For example, the optical fibers in the second group can form V-like shapes that are mirror images of each other. A suitable bifurcated optical fiber is available from Verity Instruments, Inc. of Carrollton, Tex.

There is usually an optimal distance between the window 36 of the polishing pad 30 and the end of the trunk 58a of bifurcated fiber cable 58 proximate to the window 36 of the polishing pad 30. The distance can be empirically determined and is affected by, for example, the reflectivity of the window 36, the shape of the light beam emitted from the bifurcated fiber cable, and the distance to the substrate being monitored. In some implementations, the bifurcated fiber cable is situated so that the end proximate to the window 36 is as close as possible to the bottom of the window 36 without actually touching the window 36. With this implementation, the polishing station 150 can include a mechanism, e.g., as part of the optical head 53, that is operable to adjust the distance between the end of the bifurcated fiber cable 58 and the bottom surface of the polishing pad window 36. Alternatively, the proximate end of the bifurcated fiber cable is embedded in the window 36.

The light source 51 is operable to emit light in the near infrared range, e.g., monochromatic light, e.g., light with a wavelength of about 1.3 microns. Alternatively, the light source 51 can be configured to emit light with a narrow bandwidth, e.g. around 1.3 microns. Alternatively, the light source 51 can be configured to emit light with a wide bandwidth in the near infrared range, e.g., including light around 1.3 microns, and the detector 52 can be configured to detect light with a narrower bandwidth, e.g. around 1.3 microns, or the detector can be a spectrometer configured to use intensity measurements from the near infrared range, e.g. around 1.3 microns.

Figure 14A:
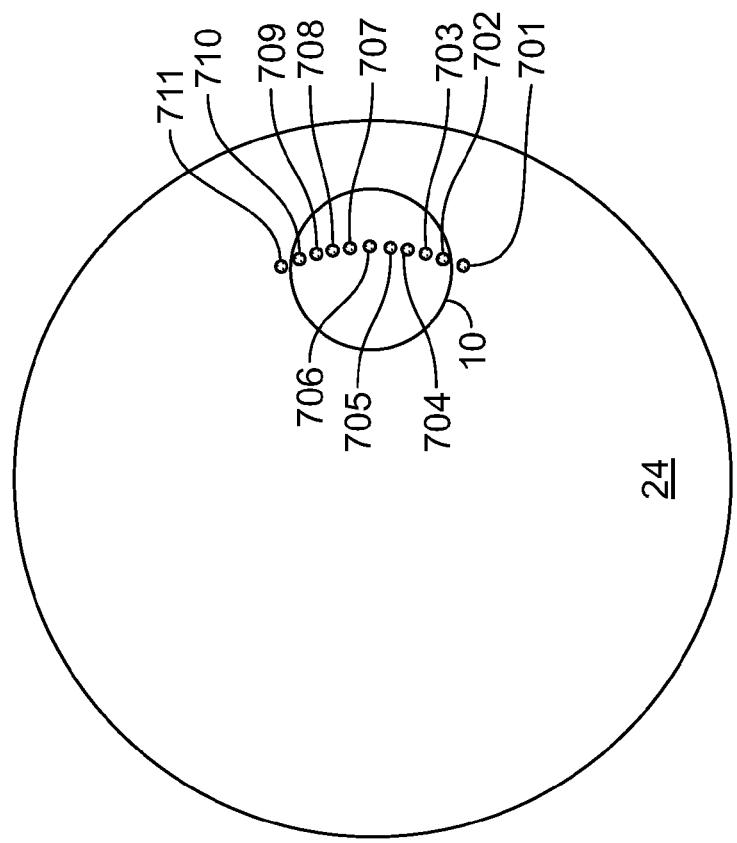
FIG. 14A shows an overhead view of a substrate on a platen and shows locations where measurements are taken.

The light source 51 and light detector 52 are connected to the controller 90 to control their operation and to receive their signals. With respect to control, the controller 90 can, for example, synchronize activation of the light source 51 with the rotation of the platen 24. As shown in FIG. 14A, the controller 90 can cause the light source 51 to emit a series of flashes starting just before and ending just after the substrate 10 passes over the in-situ monitoring module. (Each of points 701-711 depicted represents a location where light from the in-situ monitoring module impinged and reflected off.) Alternatively, the controller 90 can cause the light source 51 to emit light continuously starting just before and ending just after the substrate 10 passes over the in-situ monitoring module. Although not shown, each time the substrate 10 passes over the monitoring module, the alignment of the substrate 10 with the monitoring module can be different than in the previous pass. Over one rotation of the substrate 10, intensity measurements are obtained from different angular locations on the substrate 10, as well as different radial locations. That is, some intensity measurements are obtained from locations closer to the center of the substrate 10 and some are closer to the edge. The controller can sort the intensity measurements from the substrate 10 into groups corresponding to the concentric radial zones, e.g., by calculating the distance between the location of the intensity measurement and the center of the substrate. The radial zones can corresponding to the different controllable zones on the carrier head 80. For example, referring to FIG. 14B, the intensity measurements can be sorted into groups corresponding to concentric radial zones Z1, Z2, Z3, Z4 and Z5 on the substrate 10. Three, four, five, six, seven or more zones can be defined on the surface of the substrate 10.

With respect to receiving signals, the controller 90 can receive, for example, a signal with the intensity of light received by the light detector 52. The controller 90 can process the signal to when the layer under the GST was exposed, and use this information to adjust the polishing parameters, e.g., pressure in one of the carrier head chambers, in order to improve polishing uniformity.

Figure 15:
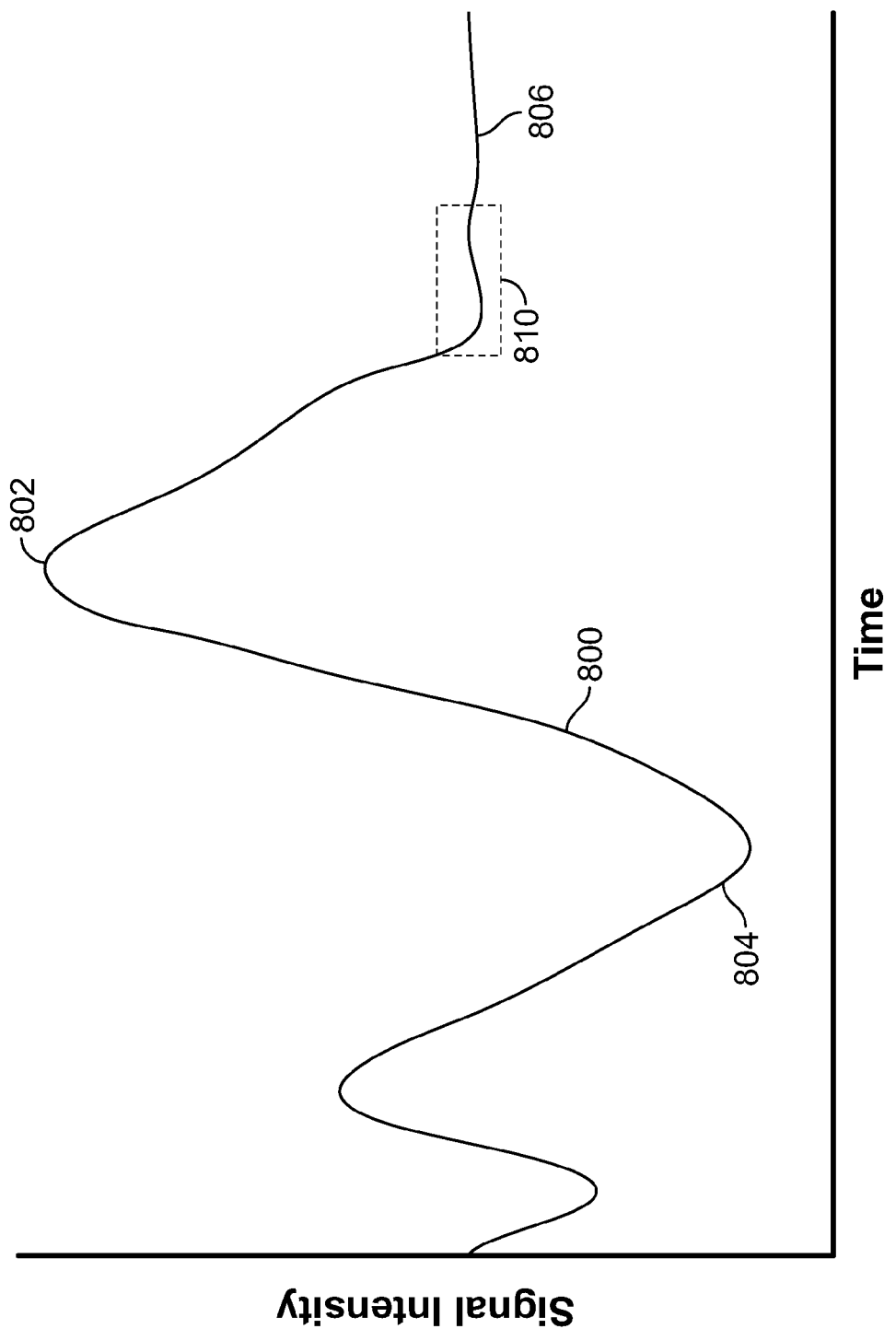
FIG. 15 shows a schematic exemplary graph of signal intensity as a function of time for a substrate being polished.

Referring to FIG. 15, for a given radial zone, the sequence of measurements from a series of sweeps of the sensor generates an intensity trace 800 which is a function of time or number of platen rotations. As illustrated, the intensity of light reflected from the substrate 10 evolves as polishing progresses, passing through one or more peaks 802 and/or valleys 804, and then stabilizing at a plateau 806. While the intensity trace 800 shown in FIG. 15 is merely illustrative, and have many other shapes, intensity traces generated during polishing of GST will have a common feature in that after an initial period of variation, the intensity trace stabilizes at a plateau 806.

Without being limited to any particular theory, as the GST layer is being polished, its thickness changes. The change in thickness causes a variation in the interference between the light reflected from the surface of the GST layer and any underlying layer, resulting in variations in the intensity of the reflected light. However, once the layer underlying the GST layer is exposed, the signal is primarily due to reflection from the underlying layer, and the reflected signal intensity stabilizes. By detecting when the intensity trace stabilizes, the controller can determine the time at which the GST layer was cleared and the underlying layer was exposed. Detection of stabilization of the intensity trace can include detecting whether the slope of the trace remains within a predetermined range (near zero slope) for some threshold time period 810. Detection of stabilization of the intensity trace can also include detecting whether the magnitude of the trace remains within a range (set relative to the magnitude at the beginning of the time period) for the threshold time period.

Figure 16:
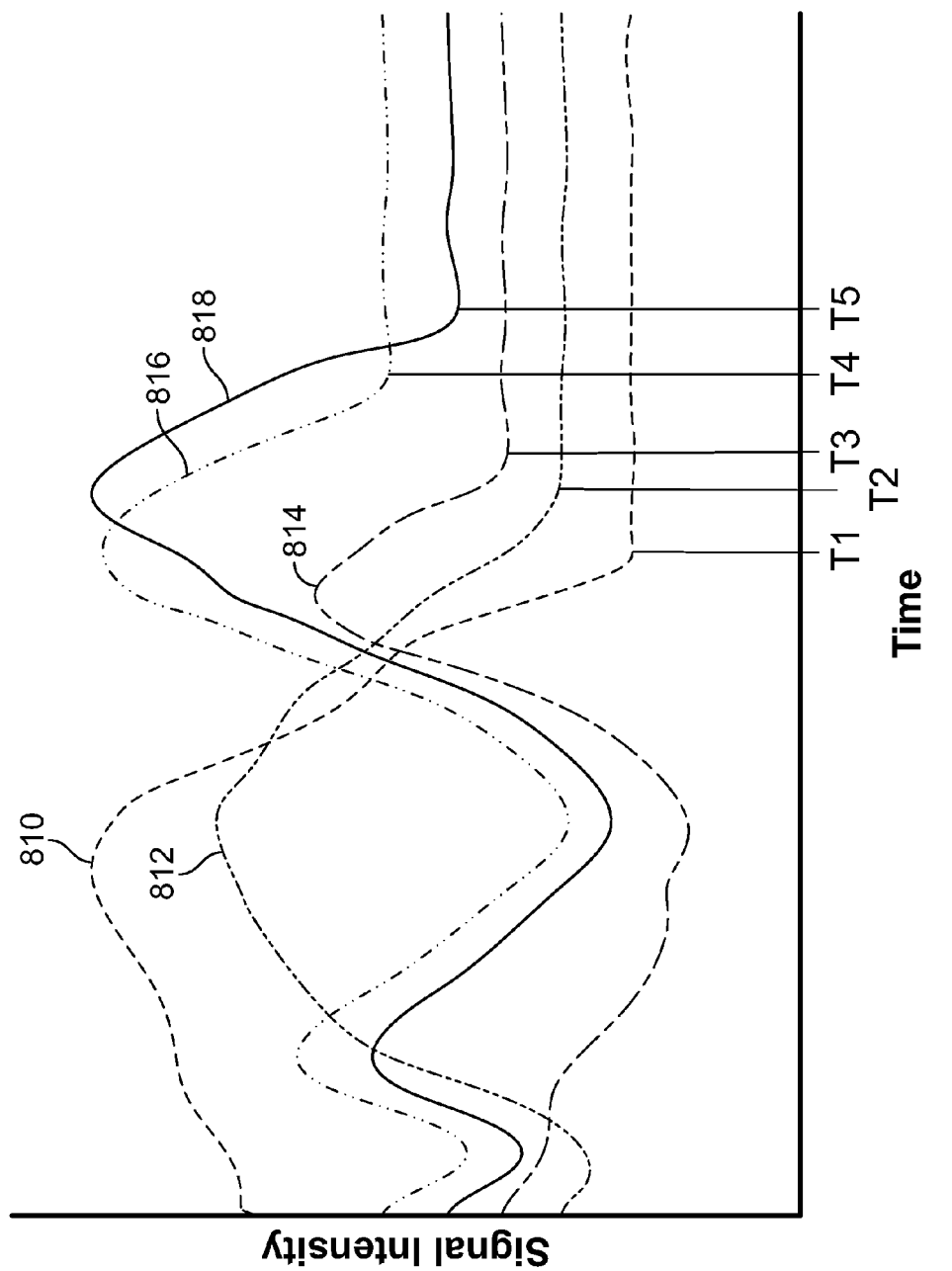
FIG. 16 shows a schematic exemplary graph of signal intensities from multiple regions of a substrate being polished.

As noted above, the intensity measurements from the optical sensor can be sorted into different radial zones. This permits creation of a separate intensity trace for each radial zone. For example, as shown in FIG. 16, if the intensity traces are divided into five radial zones, then five corresponding traces, e.g., traces 810, 812, 814, 816 and 818, can be generated.

A method of polishing will be explained with reference to FIG. 17. A first substrate with a GST layer is polished using a carrier head with multiple controllable zones and using a default pressure for each zone (step 910). For example, if there are five zones, then pressures P1, P2, P3, P4 and P5 can be applied by the five chambers of the carrier head to the respective zones Z1, Z2, Z3, Z4 and Z5 (see FIG. 14B) on the substrate. During polishing, the thickness of the GST layer is monitored in-situ using the optical monitoring system. Intensity measurements from the monitoring system are sorted into groups corresponding to radial zones, and for each zone, the time that the GST layer is cleared to expose the underlying layer is calculated based on the measurements from the corresponding group (step 920). For example, referring to FIG. 16, five intensity traces 810, 812, 814, 816 and 818, can be generated, with resulting clearance times T1, T2, T3, T4 and T5, for the respective zones Z1, Z2, Z3, Z4 and Z5 (see FIG. 14B).

Returning to FIG. 17, next, adjusted polishing pressures are calculated for at least one of the controllable zones of the carrier head (step 930). Pressures can be calculated under a simple Prestonian model to adjust the polishing rates to cause each zone to clear at approximately the same time. One zone, e.g., the innermost zone Z5, can be selected as the reference zone. For each other zone, an adjusted pressure is calculated by multiplying the default pressure by the ratio of the polishing time of the zone being adjusted to the polishing time of the reference zone. For example, adjusted pressures P1', P2', P3' and P4' for zones Z1, Z2, Z3, Z4 can be calculated as P1'=P1*(T1/T5), P2'=P2*(T2/T5), P3'=P3*(T3/T5) and P4'=P4*(T4/T5). Alternatively, the outermost zone, or one of the middles zones, could be selected as the reference zone. A subsequent substrate is then polished with the adjusted polishing pressures (step 940).

Polishing of the subsequent substrate can monitored with the optical monitoring system), a new set of clearance times T1, T2, T3, T4 and T5, for the respective zones Z1, Z2, Z3, Z4 and Z5 can be determined (step 910), and a new set of adjusted pressures calculated with the previously calculated adjusted pressures being used as the new default pressures (step 920), and another substrate polished with the new set of adjusted pressures. More generally, the system can perform an iterative feedback method, in which, for each next substrate to be polished, the clearance times and pressures for the prior substrate are used to calculate adjusted pressures for the next substrate. In addition, it is possible that adjusted pressures could be calculated based on a weighted running average of clearance times and/or pressures for multiple prior substrate, rather than only the immediately prior substrate.

In some implementations, features of the traces other than the stable region can be used for endpoint and for feedback control of the pressures applied by the chambers in the carrier head. For example, referring to FIGS. 18 and 19, this process is similar to the process described above with reference to FIGS. 16 and 17. A first substrate with a GST layer is polished using a carrier head with multiple controllable zones and using a default pressure for each zone (step 960). During polishing, the thickness of the GST layer is monitored in-situ using the optical monitoring system. Intensity measurements from the monitoring system are sorted into groups corresponding to radial zones. However, rather than detecting the time that the GST layer is cleared (which would be indicated by the plateau 806), the controller detects the time that the GST layer has a defined thickness. Specifically, the controller determines the times T1, T2, T3, T4 and T5, at which the intensity traces 810, 812, 814, 816 and 818 reach a predefined feature of the trace, e.g., a peak 802 or valley 804 of the trace, for the respective zones Z1, Z2, Z3, Z4 and Z5. When all intensity traces have reached the predefined feature, polishing of the substrate at that platen can halt. The determined times T1, T2, T3, T4 and T5 can be used in calculation of one or more adjusted pressures for polishing of a subsequent substrate, as discussed above. This feedback mechanism can result in the GST layer reaching the predefined thickness in each zone at approximately the same time, improving uniformity.

Figure 17:
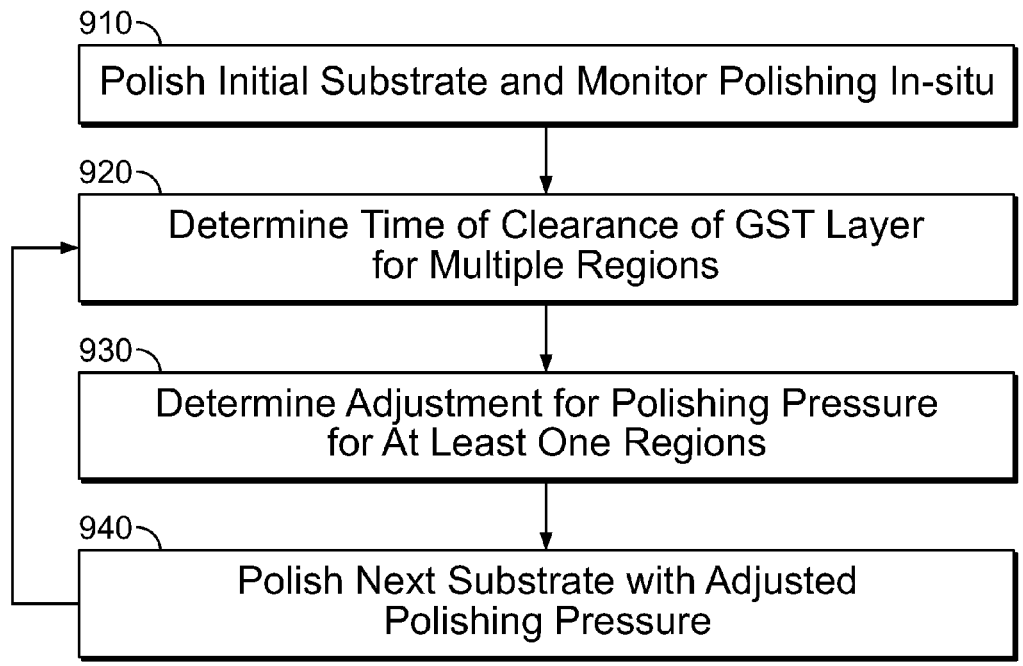
FIG. 17 shows a flow chart for a polishing process.
Figure 19:
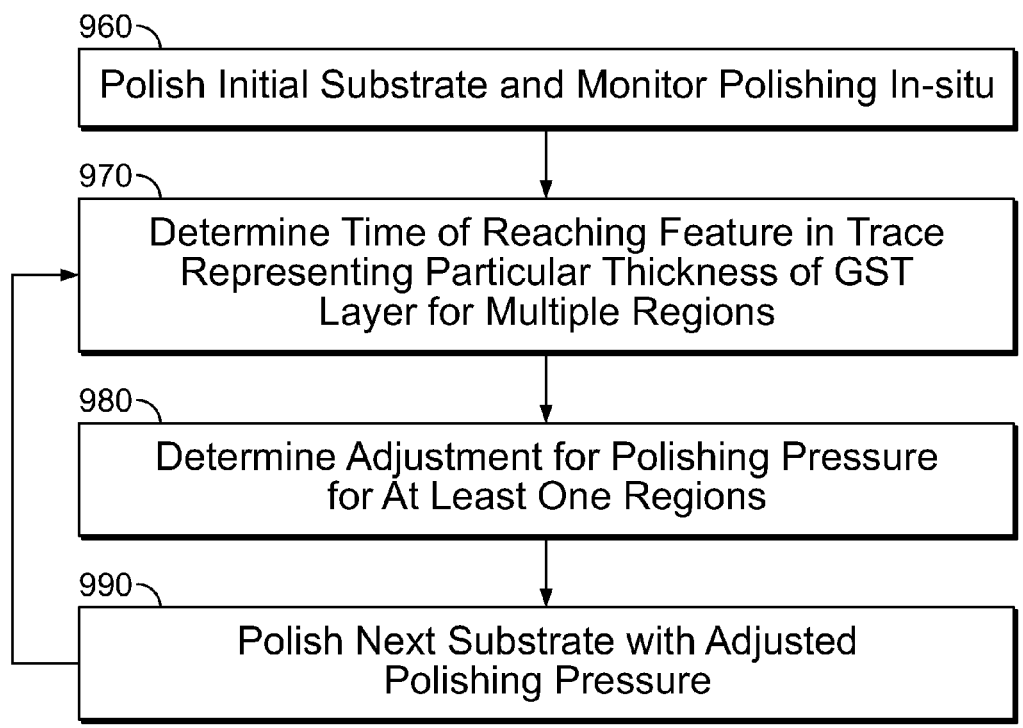
FIG. 19 shows a flow chart for another implementation of a polishing process.
Figure 18:
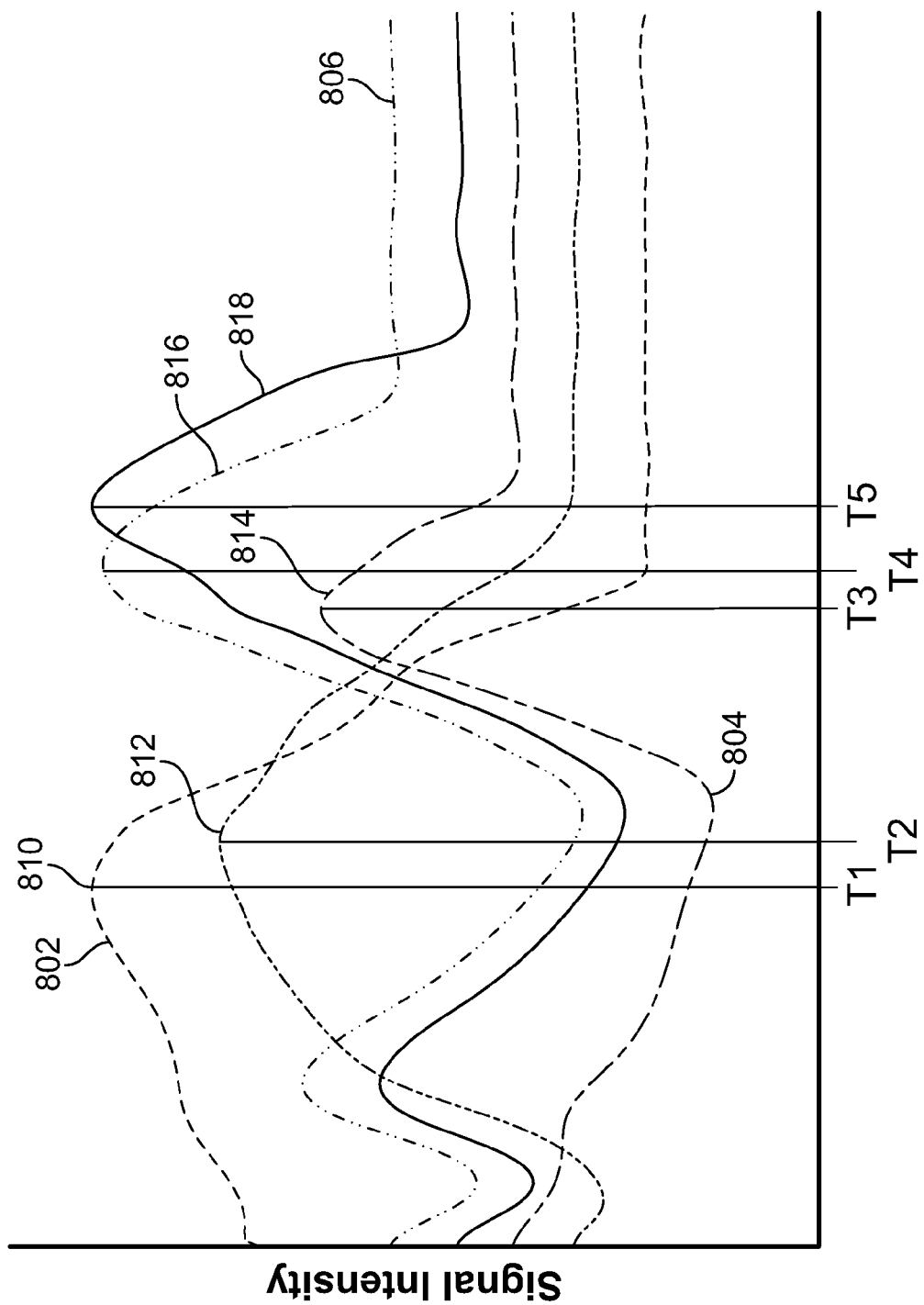
FIG. 18 shows a schematic exemplary graph of signal intensities from multiple regions of a substrate being polished.

In some implementations, a substrate with a GST layer is polished at a first platen using the technique described for FIGS. 18 and 19, and then polished at a second platen using the technique described for FIGS. 16 and 17. That is, the substrate is polished at the first platen, the thickness of the GST layer is monitored in-situ using a first optical monitoring system, intensity measurements from the first monitoring system are sorted into groups corresponding to radial zones, the controller detects the times at which the intensity traces reach predefined features, and one or more adjusted pressures for polishing a subsequent substrate at the first platen are calculated. Then the substrate is polished at a second platen, the thickness of the GST layer is monitored in-situ using a second optical monitoring system, intensity measurements from the second monitoring system are sorted into groups corresponding to radial zones, the controller detects the times at which the intensity traces reach the plateau indicating that GST layer has cleared, and one or more adjusted pressures for polishing a subsequent substrate at the second platen are calculated.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more computer program products, i.e., one or more computer programs tangibly embodied in an information carrier, e.g., in a machine readable storage device or matters capable of effecting a propagated signal, for execution by, or to control the operation of, data processing apparatus, e.g., a programmable processor, a computer, or multiple processors or computers.

A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The above described polishing apparatus and methods can be applied in a variety of polishing systems. Either the polishing pad, or the carrier head, or both can move to provide relative motion between the polishing surface and the wafer. For example, the platen may orbit rather than rotate. The polishing pad can be a circular (or some other shape) pad secured to the platen. Some aspects of the endpoint detection system may be applicable to linear polishing systems (e.g., where the polishing pad is a continuous or a reel-to-reel belt that moves linearly). The polishing layer can be a standard (for example, polyurethane with or without fillers) polishing material, a soft material, or a fixed-abrasive material. Terms of relative positioning are used; it should be understood that the polishing surface and wafer can be held in a vertical orientation or some other orientations.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

What is claimed is:

1. A method, comprising:
    polishing, at a first polishing station, a first substrate having an overlying layer on an underlying layer;
    during polishing of the first substrate at the first polishing station, directing a first light beam onto the overlying layer, the first light beam reflecting from the first substrate to generate a first reflected light beam;
    during polishing of the first substrate at the first polishing station, generating a first sequence over time of first measurements of intensity of the first reflected light beam from the first substrate;
    sorting the first measurements into groups, each group associated with a different zone of a plurality of zones on the first substrate;
    for each zone determining a first time at which the first sequence over time of first measurements from the associated group exhibits a first predefined feature indicating a predetermined thickness of the overlying layer;
    calculating at least one first adjusted polishing pressure for at least one zone based on a pressure applied in the at least one zone during polishing of the first substrate at the first polishing station, the first time for the at least one zone, and the first time for another zone, the first time for the at least one zone and the first time for another zone being based on the fist time for each respective zone at which the first sequence over time of first measurements of the first substrate during polishing of the first substrate exhibits the first predefined feature;
    transferring the first substrate from the first polishing station to a second polishing station;

polishing a second substrate at the first polishing station using the at least one first adjusted polishing pressure;

polishing the first substrate at the second polishing station;

during polishing of the first substrate at the second polishing station, directing a second light beam onto the first substrate, the second light beam reflecting from the first substrate to generate a second reflected light beam;

during polishing of the first substrate at the second polishing station, generating a second sequence over time of second measurements of intensity of the second reflected light beam;

sorting the second measurements into groups, each group associated with a different zone of the plurality of zones on the first substrate;

for each zone determining a second time at which the second sequence over time of second measurements from the associated group exhibits a second predefined feature indicating clearance of the overlying layer and exposure of the underlying layer;

calculating at least one second adjusted polishing pressure for at least one zone based on a pressure applied in the at least one zone during polishing of the first substrate at the second polishing station, the second time for the at least one zone, and the second time for another zone, the second time for the at least one zone and the second time for another zone being based on the second time for each respective zone at which the second sequence over time of second measurements of the first substrate during polishing of the first substrate exhibits the second predefined feature; and polishing the second substrate at the second polishing station using the at least one second adjusted polishing pressure.

2. The method of claim 1, wherein the first light beam and the second light beam are non-polarized light.

3. The method of claim 2, wherein the first light beam and the second light beam are laser beams.

4. The method of claim 1, wherein the overlying layer comprises GST.

5. A method of polishing, comprising:

polishing, at a first polishing station, a first substrate having an overlying layer on an underlying layer;

during polishing of the first substrate at the first polishing station, monitoring the first substrate with a first in-situ monitoring system to generate a first sequence over time of first measurements that depend on a thickness of the overlying layer;

sorting the first measurements into groups, each group associated with a different zone of a plurality of zones on the first substrate;

for each zone, determining a first time at which the first sequence over time of first measurements from the associated group exhibits a first predefined feature indicating a predetermined thickness of the overlying layer;

calculating at least one first adjusted polishing pressure for at least one zone based on a pressure applied in the at least one zone during polishing of the first substrate at the first polishing station, the first time for the at least one zone, and the first time for another zone, the first time for the at least one zone and the first time for another zone being based on the fist time for each respective zone at which the first sequence over time of first measurements of the first substrate during polishing of the first substrate exhibits the first predefined feature;

transferring the first substrate from the first polishing station to a second polishing station;

polishing a second substrate at the first polishing station using the at least one first adjusted polishing pressure;

polishing the first substrate at the second polishing station;

during polishing of the first substrate at the second polishing station, monitoring the first substrate with a second in-situ monitoring system to generate a second sequence over time of second measurements that depend on the thickness of the overlying layer;

sorting the second measurements into groups, each group associated with a different zone of the plurality of zones on the first substrate;

for each zone, determining a second time at which the second sequence over time of second measurements from the associated group exhibits a second predefined feature indicating clearance of the overlying layer and exposure of the underlying layer;

calculating at least one second adjusted polishing pressure for at least one zone based on a pressure applied in the at least one zone during polishing of the first substrate at the second polishing station, the second time for the at least one zone, and the second time for another zone, the second time for the at least one zone and the second time for another zone being based on the second time for each respective zone at which the second sequence over time of second measurements of the first substrate during polishing of the first substrate exhibits the second predefined feature; and polishing the second substrate at the second polishing station using the at least one second adjusted polishing pressure.

6. The method of claim 5, wherein the plurality of zones are concentric and the at least one zone is an outermost zone of the plurality of zones.

7. The method of claim 6, wherein the another zone is an inner zone of the plurality of zones.

8. The method of claim 5, wherein calculating the first adjusted pressure P' comprises calculating $P'=P*(T1/T2)$ wherein P is the pressure applied in the at least one zone during polishing of the first substrate at the first polishing station, T1 is the first time for the at least one zone and T2 is the first time for the another zone.

9. The method of claim 5, wherein calculating the second adjusted pressure P2' comprises calculating $P2'=P2*(T1/T2)$ wherein P2 is the pressure applied in the at least one zone during polishing of the first substrate at the second polishing station, T1 is the second time for the at least one zone and T2 is the second time for the another zone.

10. The method of claim 5, wherein determining the first time at which the first sequence over time of first measurements exhibits the first predefined feature indicating the predetermined thickness of the overlying layer comprises determining a peak in the first sequence over time of first measurements stabilizes.

11. The method of claim 5, wherein determining the second time at which the second sequence over time of second measurements from the associated group exhibits the second predefined feature indicating clearance of the overlying layer and exposure of the underlying layer comprises determining a time at which the second sequence over time of second measurements stabilizes.

12. The method of claim 11, wherein determining the time at which the second sequence of measurements over time stabilizes includes determining that a slope of a trace generated by the second sequence over time of second measurements remains within a predetermined range for a predetermined time period.

13. The method of claim 5, wherein the first in-situ monitoring system and the second in-situ monitoring system are optical monitoring systems.

14. A computer program product for controlling polishing, embodied in a non-transitory computer-readable medium, having stored thereon instructions for causing a processor to:
cause a first substrate to be polished at a first polishing station;
during polishing of the first substrate at the first polishing station, receive from a first in-situ monitoring system a first sequence over time of first measurements that depend on a thickness of an overlying layer on the first substrate;
sort the first measurements into groups, each group associated with a different zone of a plurality of zones on the first substrate;
for each zone, determine a first time at which the first sequence over time of first measurements from the associated group exhibits a first predefined feature indicating a predetermined thickness of the overlying layer;
calculate at least one first adjusted polishing pressure for at least one zone based on a pressure applied in the at least one zone during polishing of the first substrate at the first polishing station, the first time for the at least one zone, and the first time for another zone, the first time for the at least one zone and the first time for another zone being based on the fist time for each respective zone at which the first sequence over time of first measurements of the first substrate during polishing of the first substrate exhibits the first predefined feature;
cause the first substrate to be transferred from the first polishing station to a second polishing station and polished at the second polishing station;
cause a second substrate to be polished at the first polishing station using the at least one first adjusted polishing pressure;
during polishing of the first substrate at the second polishing station, receive from a second in-situ monitoring system a second sequence over time of second measurements that depend on the thickness of the overlying layer on the first substrate;
sort the second measurements into groups, each group associated with a different zone of the plurality of zones on the first substrate;
for each zone, determine a second time at which the second sequence over time of second measurements from the associated group exhibits a second predefined feature indicating clearance of the overlying layer and exposure of the underlying layer;
calculate at least one second adjusted polishing pressure for at least one zone based on a pressure applied in the at least one zone during polishing of the first substrate at the second polishing station, the second time for the at least one zone, and the second time for another zone, the second time for the at least one zone and the second time for another zone being based on the second time for each respective zone at which the second sequence over time of second measurements of the first substrate during polishing of the first substrate exhibits the second predefined feature; and
cause the second substrate to be polished at the second polishing station using the at least one second adjusted polishing pressure.

15. The computer program product of claim 14, wherein the plurality of zones are concentric and the at least one zone is an outermost zone of the plurality of zones.

16. The computer program product of claim 15, wherein the another zone is an inner zone of the plurality of zones.

17. The computer program product of claim 14, wherein the instructions to calculate the first adjusted pressure P' comprise instructions to calculate $P'=P*(T1/T2)$ wherein P is the pressure applied in the at least one zone during polishing of the first substrate at the first polishing station, T1 is the first time for the at least one zone and T2 is the first time for the another zone.

18. The computer program product of claim 14, wherein the instructions to calculate the second adjusted pressure P2' comprise instructions to calculate $P2'=P2*(T1/T2)$ wherein P2 is the pressure applied in the at least one zone during polishing of the first substrate at the second polishing station, T1 is the second time for the at least one zone and T2 is the second time for the another zone.

19. The computer program product of claim 14, wherein the instructions to determine the first time at which the first sequence over time of first measurements exhibits the first predefined feature indicating the predetermined thickness of the overlying layer comprise instructions to determine a peak in the first sequence over time of first measurements stabilizes.

20. The computer program product of claim 14, wherein the instructions to determine the second time at which the second sequence over time of second measurements from the associated group exhibits the second predefined feature indicating clearance of the overlying layer and exposure of the underlying layer comprise instructions to determine a time at which the second sequence over time of second measurements stabilizes.

21. The computer program product of claim 20, wherein the instructions to determine the time at which the second sequence of measurements over time stabilizes comprise instructions to determine that a slope of a trace generated by the second sequence over time of second measurements remains within a predetermined range for a predetermined time period.

* * * * *

UNITED STATES PATENT AND TRADEMARK OFFICE
CERTIFICATE OF CORRECTION

PATENT NO. : 9,496,190 B2  
APPLICATION NO. : 14/665889  
DATED : November 15, 2016  
INVENTOR(S) : Kun Xu et al.

Page 1 of 1

It is certified that error appears in the above-identified patent and that said Letters Patent is hereby corrected as shown below:

In the Claims

In Claim 1, Column 22, Line 61, delete "fist" and insert -- first --.

In Claim 5, Column 23, Line 66, delete "fist" and insert -- first --.

In Claim 14, Column 25, Line 35, delete "fist" and insert -- first --.

Signed and Sealed this
Tenth Day of January, 2017

Michelle K. Lee
*Director of the United States Patent and Trademark Office*